United States Patent
Suzuki et al.

(10) Patent No.: US 8,981,689 B2
(45) Date of Patent: Mar. 17, 2015

(54) DRIVER FOR SWITCHING ELEMENT AND CONTROL SYSTEM FOR ROTARY MACHINE USING THE SAME

(71) Applicant: Denso Corporation, Kariya, Aichi-pref. (JP)

(72) Inventors: Tomotaka Suzuki, Nagoya (JP); Ryotaro Miura, Kariya (JP); Takeyasu Komatsu, Chiryu (JP)

(73) Assignee: Denso Corporation, Kariya (JP)

( * ) Notice: Subject to any disclaimer, the term of this patent is extended or adjusted under 35 U.S.C. 154(b) by 52 days.

(21) Appl. No.: 14/012,252

(22) Filed: Aug. 28, 2013

(65) Prior Publication Data

US 2014/0062361 A1    Mar. 6, 2014

(30) Foreign Application Priority Data

Aug. 28, 2012   (JP) .................................. 2012-187193

(51) Int. Cl.
| | | |
|---|---|---|
| H02P 1/04 | (2006.01) | |
| H03K 17/042 | (2006.01) | |
| H02P 6/14 | (2006.01) | |
| H02M 1/08 | (2006.01) | |
| H02M 7/5387 | (2007.01) | |
| H02M 1/00 | (2006.01) | |

(52) U.S. Cl.
CPC ............ *H03K 17/04206* (2013.01); *H02P 6/14* (2013.01); *H02M 1/08* (2013.01); *H02M 7/5387* (2013.01); *H02M 2001/0029* (2013.01)
USPC ............ 318/400.17; 318/400.19; 318/400.22; 318/722

(58) Field of Classification Search
USPC ............ 318/400.17, 400.19, 400.22, 400.26, 318/722, 434; 327/108, 109
See application file for complete search history.

(56) References Cited

U.S. PATENT DOCUMENTS

| | | | | |
|---|---|---|---|---|
| 4,987,964 | A * | 1/1991 | Tabuse ........................ | 180/446 |
| 5,808,504 | A * | 9/1998 | Chikai et al. .................. | 327/434 |
| 7,242,238 | B2 * | 7/2007 | Higashi ........................ | 327/427 |
| 7,362,147 | B2 * | 4/2008 | Rebholz-Goldmann ..... | 327/108 |
| 8,829,836 | B2 * | 9/2014 | Fukuta et al. ............ | 318/400.27 |
| 2011/0285335 | A1 * | 11/2011 | Tada ........................ | 318/400.22 |

FOREIGN PATENT DOCUMENTS

JP            3339311          8/2002

* cited by examiner

*Primary Examiner* — Bentsu Ro
*Assistant Examiner* — Thai Dinh
(74) *Attorney, Agent, or Firm* — Nixon & Vanderhye PC

(57) ABSTRACT

In a driver, a discharging module discharges, at a discharging rate, the on-off control terminal of a switching element in response to a drive signal being shifted from an on state to an off state. A changing module determines whether a condition including a level of a sense signal being higher than a threshold level during the on state of the drive signal is met, and changes the discharging rate of the on-off control terminal in response to the drive signal being shifted from the off state to the on state upon determination that the condition is met. A loosening module loosens the condition after a lapse of a period since the shift of the drive signal from the off state to the on state in comparison to the condition immediately after the shift of the drive signal from the off state to the on state.

10 Claims, 10 Drawing Sheets

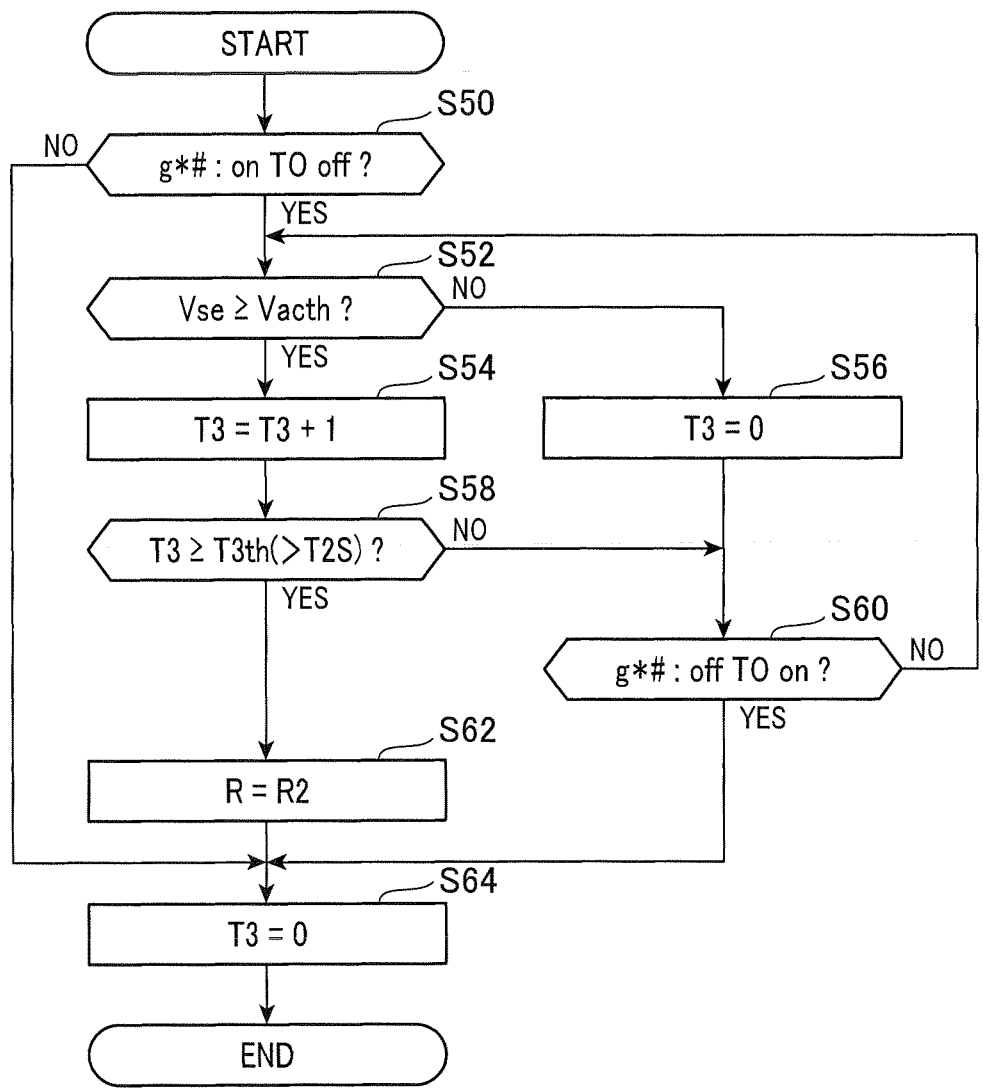

FIG.9B
VH ≥ Vhth
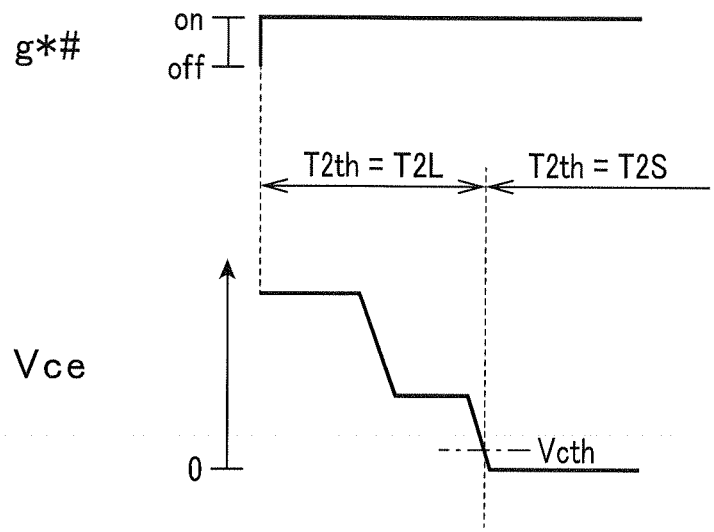
VH < Vhth
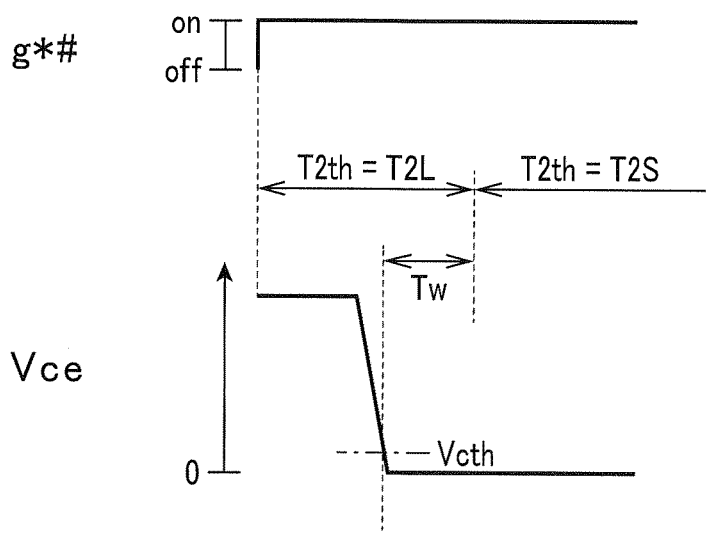

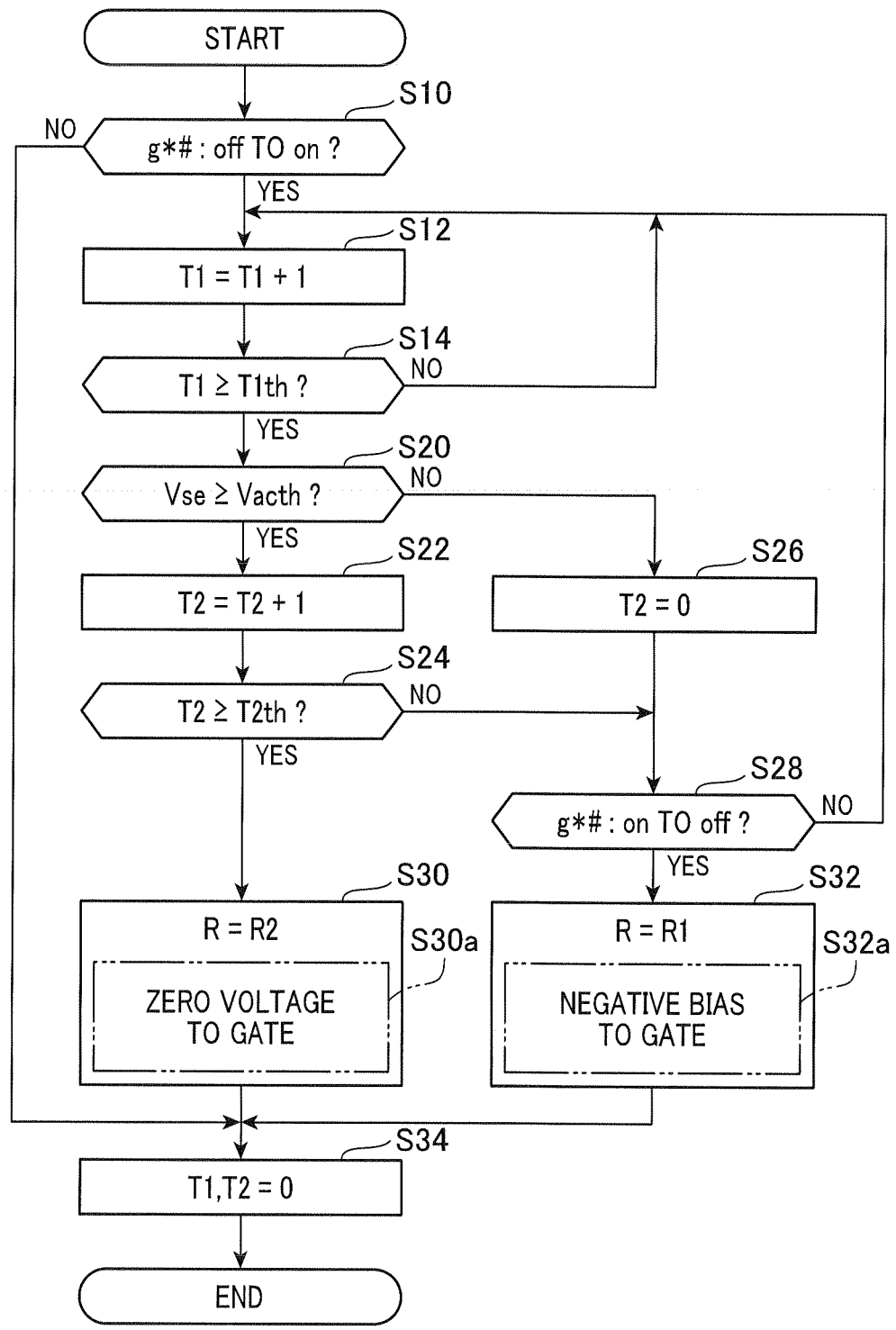

DRIVER FOR SWITCHING ELEMENT AND CONTROL SYSTEM FOR ROTARY MACHINE USING THE SAME

CROSS REFERENCE TO RELATED APPLICATIONS

This application is based on and claims the benefit of priority from Japanese Patent Application 2012-187193 filed on Aug. 28, 2012, the disclosure of which is incorporated in its entirety herein by reference.

TECHNICAL FIELD

The present disclosure relates to drivers for a switching element having a sense terminal for outputting a minute current, referred to as a sense current, correlated with a current flowing through the current conductive path of the switching element. The present disclosure also relates to control systems for rotary machines using the drivers.

BACKGROUND

A typical example of these drives is disclosed in Japanese Patent Publication No. 3339311. The driver of an IGBT (Insulated-Gate Bipolar Transistor) as an example of switching elements is capable of changing the switching speed of the IGBT from an on state to an off state to thereby maintain a balance between reduction in surge voltages and a reduction in switching loss. For example, in the patent Publication, the IGBT has a sense terminal for outputting a sense current correlated with a current flowing through the current conductive path of the IGBT, and the driver changes the switching speed of the IGBT based on the minute current output from the sense terminal.

SUMMARY

However, it is technically difficult to change the switching speed of the IGBT during the transition period, i.e. the turn-off period, from the on state to the off state. Note that the transition period from the off state to the on state of a transistor, such as an IGBT, will also be referred to as a turn-on period. Thus, the inventors of this application have studied a simple technical approach to change the switching speed of the IGBT in a next switching cycle according to the amount of a current flowing through the IGBT while the IGBT is in the on state during the current switching cycle.

In this study, let us consider measurement of the amount of the sense current, which is output from the sense terminal with the IGBT being on, as voltage drop across a resistor connected between the sense terminal and the emitter of the IGBT.

This measurement results in a value of the voltage drop increasing immediately after the start of changing the IGBT from the off state to the on state in comparison to a value of the voltage drop at a point of time within the turn-on period following the start of changing the IGBT from the off state to the on state. This phenomenon demonstrates that a value of the voltage drop immediately after the start of changing the IGBT from the off state to the on state is different from that of the voltage drop at a given point of time within the turn-on period of the IGBT even if the amount of the current flowing through the IGBT is kept constant within the turn-on period.

For this reason, comparing a value of the voltage drop with a threshold value thereby determining the switching speed of the IGBT from the on state to the off state may result in the switching speed being determined as an improper value.

In view of the circumstances set forth above, one aspect of the present disclosure seeks to provide drivers for a switching element having an output terminal for outputting a current correlated with a current flowing through the current conductive path thereof, which are designed to solve the problem set forth above.

Specifically, an alternative aspect of the present disclosure aims to provide such drivers, which are capable of properly changing the switching speed of a switching element based on the output current from the output terminal.

According to a first exemplary aspect of the present disclosure, there is provided a driver for driving, in response to a drive signal, a voltage-controlled switching element having a conductive path, an on-off control terminal, and a sense terminal from which a sense signal correlated with an amount of current flowing through the conductive path is output. The driver includes a discharging module configured to discharge, at a predetermined discharging rate, the on-off control terminal of the voltage-controlled switching element for changing the voltage-controlled switching element from an on state to an off state in response to the drive signal being shifted from an on state to an off state. The driver includes a changing module. The changing module is configured to: determine whether a condition for executing reduction of the discharging rate of the on-off control terminal of a corresponding one of the voltage-controlled switching elements is met, the condition including a level of the sense signal being higher than a threshold level during the on state of the drive signal; and change the discharging rate of the on-off control terminal of a corresponding one of the voltage-controlled switching elements in response to the drive signal being shifted from the off state to the on state upon determination that the condition is met. The driver includes a loosening module configured to loosen the condition after the lapse of the predetermined period since the shift of the drive signal from the off state to the on state in comparison to the condition immediately after the shift of the drive signal from the off state to the on state.

In the first exemplary aspect of the present disclosure, immediately after the shift of the drive signal from the off state to the on state, it is determined that the level of the sense signal is likely (but not certain) to be higher than the threshold level although the amount of current actually flowing through the conductive path is low. Thus, if no loosening module were provided in the first exemplary aspect of the present disclosure, the condition for executing reduction of the discharging rate of the on-off control terminal of the voltage-controlled switching element might be met in such a case, resulting in a risk that the discharging rate of the voltage-controlled switching element might be improperly changed.

However, the driver according to the first aspect of the present disclosure is equipped with the loosening module. The loosening module loosens the condition after the lapse of the predetermined period since the shift of the drive signal from the off state to the on state in comparison to the condition immediately after the shift of the drive signal from the off state to the on state. In other words, the loosening module tightens the condition immediately after the shift of the drive signal from the off state to the on state in comparison to the condition after the lapse of the predetermined period since the shift of the drive signal from the off state to the on state. This prevents the occurrence of a risk that the discharging rate of the voltage-controlled switching element is improperly changed, thus properly changing the discharging rate of the voltage-controlled switching element.

According to a second exemplary aspect of the present disclosure, there is provided a driver for driving, in response to a drive signal, a voltage-controlled switching element having a conductive path, an on-off control terminal, and a sense terminal from which a sense signal correlated with an amount of current flowing through the conductive path is output. The driver includes a discharging module configured to discharge, at a predetermined discharging rate, the on-off control terminal of the voltage-controlled switching element for changing the voltage-controlled switching element from an on state to an off state in response to the drive signal being shifted from an on state to an off state. The driver includes a determining module configured to determine whether a condition that a duration of a level of the sense signal being higher than a threshold level is equal to or longer than threshold time is met. The driver includes a disabling module configured to disable the determining module from executing the determination until a predetermined period has elapsed since the shift of the drive signal from the off state to the on state. The driver includes a discharging-rate changing module configured to change the discharging rate of the on-off control terminal when it is determined by the determining module that the condition is met.

In the second exemplary aspect of the present disclosure, the disabling module disables the determining module from executing the determination of whether the condition that the duration of the level of the sense signal being higher than the threshold level is equal to or longer than the threshold time is met until the predetermined period has elapsed since the shift of the drive signal from the off state to the on state.

Thus, even if the condition is met before the lapse of the predetermined period since the shift of the drive signal from the off state to the on state, it is possible to prevent the discharging rate of the voltage-controlled switching element from being improperly changed. This results in proper change of the discharging rate of the voltage-controlled switching element.

According to a third exemplary aspect of the present disclosure, there is provided a control system for controlling a rotary machine. The control system includes an inverter equipped with at least one pair of voltage-controlled switching elements connected in series, each of the voltage-controlled switching elements having a conductive path, an on-off control terminal, and a sense terminal from which a sense signal correlated with an amount of current flowing through the conductive path is output. The control system includes a driver for driving each of the voltage-controlled switching elements. The driver includes a discharging module configured to discharge, at a predetermined discharging rate, the on-off control terminal of a corresponding one of the voltage-controlled switching elements for changing a corresponding one of the voltage-controlled switching elements from an on state to an off state in response to the drive signal being shifted from an on state to an off state. The driver includes a changing module configured to: determine whether a condition for executing reduction of the discharging rate of the on-off control terminal of a corresponding one of the voltage-controlled switching elements is met, the condition including a level of the sense signal being higher than a threshold level during the on state of the drive signal; and change the discharging rate of the on-off control terminal of a corresponding one of the voltage-controlled switching elements in response to the drive signal being shifted from the off state to the on state upon determination that the condition is met. The driver includes a loosening module configured to loosen the condition after the lapse of the predetermined period since the shift of the drive signal from the off state to the on state in comparison to the condition immediately after the shift of the drive signal from the off state to the on state.

Because the control system according to the third exemplary aspect of the present disclosure includes the aforementioned driver for each of the at least one pair of switching elements of the inverter, it is possible to achieve the same effects as those achieved by the driver according to the first exemplary aspect of the present disclosure.

The above and/or other features, and/or advantages of various aspects of the present disclosure will be further appreciated in view of the following description in conjunction with the accompanying drawings. Various aspects of the present disclosure can include and/or exclude different features, and/ or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 7 is a flowchart schematically illustrating an example of a second discharging-rate determining routine carried out by each drive unit of the control system according to a second embodiment of the present disclosure;

FIG. 9B is graphs, one of which illustrates how collector-emitter voltage varies if an input voltage to the inverter is equal to or higher than a threshold voltage, and the other of which illustrates how the collector-emitter voltage varies if the input voltage to the inverter is lower than equal to or higher than the threshold voltage; and FIG. 10 is a flowchart schematically illustrating an example of a fifth discharging-rate determining routine carried out by each drive unit of the control system according to a fifth embodiment of the present disclosure.

DETAILED DESCRIPTION OF EMBODIMENT

Figure 1:
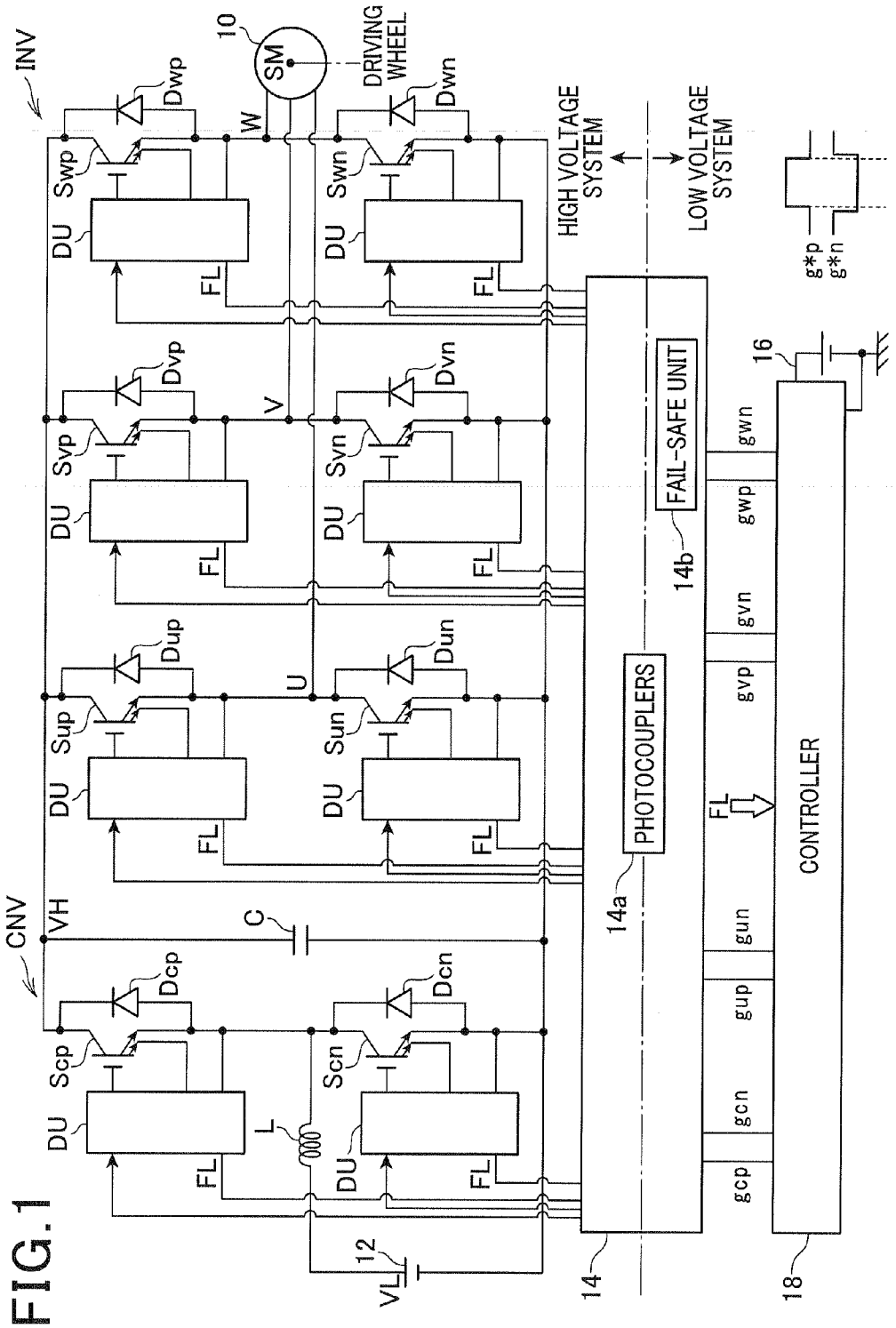
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified to avoid redundant description.

First Embodiment

Referring to FIG. 1, there is illustrated a three-phase motor-generator as an example of rotating machines, referred to simply as a "motor-generator" 10, installed in, for example, a motor vehicle as a main engine according to the first embodiment. The motor-generator 10 is mechanically coupled to driving wheels (not shown) of the motor vehicle.

For example, as the motor-generator 10, a brush-less DC motor, i.e. a three-phase SM (Synchronous Motor), is used.

The motor-generator 10 is made up of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter INV, a converter CNV, a high-voltage battery 12 as an example of DC power sources, drive units, i.e. drivers, DU, an interface 14, a low-voltage battery 16, and a control unit 18.

To the motor-generator 10, the high-voltage battery 12 is electrically connected via the inverter INV and the converter CNV. The high-voltage battery 12 has a terminal voltage thereacross, which is, for example, equal to or higher than 100 V.

The converter CNV includes a capacitor C, a pair of series-connected switching elements Scp and Scn, a pair of flywheel diodes Dcp and Dcn, and a reactor L. The capacitor C is connected in parallel to the inverter INV, and the series-connected switching elements Scp and Scn are connected in parallel to the capacitor C. The flywheel diodes Dcp and Dcn are connected in antiparallel to the corresponding switching elements Scp and Scn, respectively. One end of the reactor L is connected to both the positive terminal of the high-voltage battery 12 and the connection point between the switching elements Scp and Scn. One end of the series-connected switching elements Scp and Scn of the converter CNV is connected to the positive DC input line of the inverter INV, and the other end thereof is connected to the negative DC input line of the inverter INV. The negative DC input line of the inverter INV is connected to the negative terminal of the battery 12.

The converter CNV is operative to convert the terminal voltage of the high-voltage battery 12 into a voltage higher than the terminal voltage of the high-voltage battery 12, and output the boosted voltage as an output DC voltage thereof across the capacitor C. The predetermined upper limit of the step-up of the terminal voltage by the converter CNV is set to a predetermined high voltage, such as 666 V.

The inverter INV is designed as a three-phase inverter. The inverter INV is provided with three pairs of series-connected high- and low-side (upper- and lower-arm) switching elements Sup and Sun, Svp and Svn, and Swp and Swn. The inverter INV is also provided with flywheel diodes D*# (*=u, v, w, #=p, n) electrically connected in antiparallel to the corresponding switching elements S*# (*=u, v, w, #=p, n), respectively.

In the first embodiment, as the switching elements S*# (*=u, v, w, #=p, n), IGBTs are respectively used.

When power MOSFETs are used as the switching elements S*# (*=u, v, w, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S*p (*=u, v, w) is connected to a corresponding one of the S*n (*=u, v, w) in series is connected to an output lead extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line.

For example, the control unit 18 operates on a power-supply voltage, lower than the terminal voltage across the high-voltage battery 12, supplied from the low-voltage battery 16. Thus, the control unit 18 and the low-voltage battery 16 constitute a low voltage system. In contrast, the motor-generator 10, the converter CNV, the inverter INV, and the high-voltage battery 12 constitute a high voltage system.

The high voltage system uses a frame ground (chassis ground) of the motor vehicle as its reference potential; the reference potential is set to the median value of the potential at the positive terminal of the high-voltage battery 12 and that at the negative terminal thereof because the neutral point is connected to the frame (chassis) of the motor vehicle.

On the other hand, the low voltage system uses the frame ground of the motor vehicle as its reference potential set to the potential at the negative terminal of the low-voltage battery 16. That is, the potential at the negative terminal of the high-voltage battery 12 and that at the potential of the low-voltage battery 16 are different from each other.

The interface 14 is provided with photocouplers 14a as an example of insulation members provided for the respective switching elements S*# of the inverter INV and converter CNV. Each of the photocouplers 14a is comprised of a photodiode and a phototransistor. The photocouplers 14a are configured to enable communications between the high and low voltage systems while establishing electrical insulation therebetween. Specifically, each of the photocouplers 14a is configured to enable the control unit 18 to control a corresponding one of the switching elements S*# while establishing electrical insulation between the control unit 18 and a corresponding one of the switching elements S*#.

The control unit 18 is designed to individually drive the inverter INV and the converter CNV to thereby control a controlled variable of the motor-generator 10, such as an output torque of the motor-generator 10.

Specifically, the control unit 18 is designed to individually send drive signals gcp and gcn to the drive units DU provided for the respective switching elements Scp and Scn, thus individually turning on or off the respective switching elements Scp and Scn. The control unit 18 is also designed to individually send drive signals gup, gun, gvp, gvn, gwp, and gwn to the drive units DU provided for the respective switching elements Sup, Sun, Svp, Svn, Swp, and Swn, thus individually turning on or off the respective switching elements Sup, Sun, Svp, Svn, Swp, and Swn. The individual turn-on or off of the respective switching elements Sup, Sun, Svp, Svn, Swp, and Swn converts the output DC voltage across the capacitor C, which is an input voltage VH to the inverter INV, into an AC voltage, and supply the AC voltage to the motor-generator 10.

Each of the drive signals g*# has a predetermined duty cycle, i.e. a predetermined ratio of on duration to the total duration of each switching cycle for a corresponding one of the switching elements S*# (see FIG. 1). Specifically, the control unit 18 is designed to complementarily turn on the high- and low-side switching elements S*# for each leg (phase) via the corresponding drive units DU according to the corresponding drive signals g*#. In other words, the control unit 18 is designed to alternately turn on the high-side switching element S*p for one leg (phase) and the low-side switching element S*n for the same leg (phase). This drive alternately closes the conductive path between the collector and emitter of the high-side switching element S*p for one leg and the conductive path between the collector and emitter of the high-side switching element S*n for the same leg.

Next, an example of the circuit structure of each drive unit DU provided for a corresponding one switching element S*# will be described with reference to FIG. 2.

Figure 2:
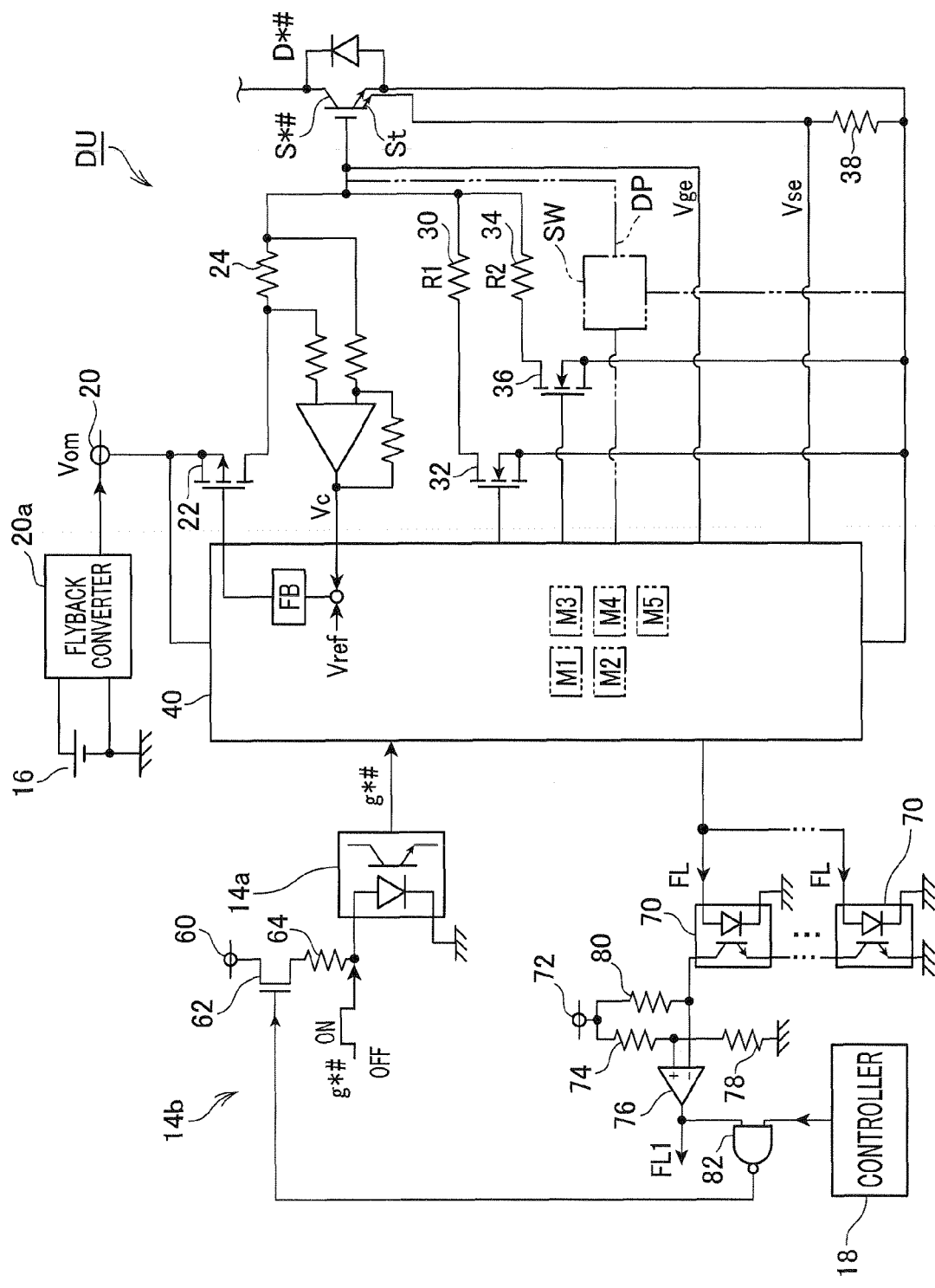
FIG. 2 is a circuit diagram schematically illustrating each drive unit of an inverter of the control system illustrated in FIG. 1.

Referring to FIG. 2, the drive unit DU is comprised of a constant voltage source 20, a constant-current switching element 22, a constant-current resistor 24, and a differential amplifier 26. The drive unit DU is also comprised of a first discharging resistor 30, a first discharging switching element 32, a second discharging resistor 34, a second discharging switching element 36, a sense resistor 38, and a drive IC 40 on a chip.

As the constant-current switching element 22, a P-channel MOSFET is used, and as each of the first and second discharging switching elements 32 and 36, an N-channel MOSFET is used.

The external constant voltage source 20 is connected to a flyback converter 20a installed in, for example, the interface 14. The flyback converter 20a is connected to the low-voltage battery 16 and operative to produce a constant voltage Vom based on the voltage across the low-voltage battery 16 as a terminal voltage of the voltage source 20. An output terminal of the voltage source 20 is connected to the source of the constant-current switching element 22. The drain of the constant-current switching element 22 is connected to one end of the constant-current resistor 24, and the other end of the constant-current resistor 24 is connected to the on-off control terminal, i.e. the gate, of the switching element S*#. The on-off control terminal, i.e. the gate, of the constant-current switching element 22 is connected to the drive IC 40.

Both ends of the constant-current resistor 24 are connected to a non-inverting and inverting input terminals of the differential amplifier 26, so that the potential difference Vc between the ends of the constant-current resistor 24 is amplified by the differential amplifier 26 to be input to the drive IC 40.

The drive IC 40 includes a feedback module FB operative to perform a feedback operation to manipulate the voltage at the gate of the constant-current switching element 22 such that the potential difference Vc input thereto is adjusted to a target level Vref. This results in the voltage drop Vc across the constant-current resistor 24 being adjusted to be a constant level, thus maintaining a charge current for the gate of the switching element S*# based on the constant voltage Vom via the constant-current resistor 24 at a constant level.

The gate of the switching element S*# is also connected to a reference end, i.e. the emitter, which is one end of the current conductive path, of the switching element S*# via the first discharging resistor 30, the first discharging switching element 34, and the common potential line of the drive unit DU. Specifically, the gate of the switching element S*# is connected to one end of the first discharging resistor 30, and the other end of the first discharging resistor 30 is connected to the drain of the first discharging switching element 32. The source of the first discharging switching element 32 is connected to the emitter of the switching element S*# via the common potential line.

Similarly, the gate of the switching element S*# is connected to the emitter of the switching element S*# via the second discharging resistor 34, the second discharging switching element 36, and the common potential line of the drive unit DU. Specifically, the gate of the switching element S*# is connected to one end of the second discharging resistor 34, and the other end of the second discharging resistor 34 is connected to the drain of the second discharging switching element 36. The source of the second discharging switching element 36 is connected to the emitter of the switching element S*# via the common potential line.

Each of the first and second discharging resistors 30 and 34 is a linear element. The first and second discharging resistors 30 and 34 have respective resistances R1 and R2; the resistance R1 of the first discharging resistor 30 is lower than the resistance R2 of the second discharging resistor 34. The difference between the resistances R1 and R2 of the resistors 30 and 34 results in the difference in resistance between the first and second discharging paths for discharging the gate of the switching element S*#, i.e. for discharging positive charge stored thereon, to turn off the switching element S*#. Selecting one of the first and second discharging paths enables active gate control, i.e. adjustment of the gate voltage, for the switching element S*#.

That is, the resistance of each of the first and second discharging paths serves as a parameter for adjusting the rate of discharging the gate of the switching element S*# according to the first embodiment. Changing the resistance in the discharge path of the switching element S*# between the different resistances R1 and R2 aims to effectively reduce both a surge and switching loss due to the switching operations of the switching element S*#.

Note that, as described above, the drive unit DU according to the first embodiment uses constant-current control to supply a constant charge current to the gate of the switching element S*#. In comparison to a case where the drive unit DU uses constant-voltage control to apply a constant voltage to the gate of the switching element S*#, the drive unit DU according to the first embodiment results in reduction in both a surge and switching loss due to the switching operations of the switching element S*#.

The drive IC 40 is operative to individually control turn-on or turnoff of each of the constant-current switching element 22, the first discharging switching element 32, and the second discharging switching element 36.

In the first embodiment, the drive IC 40 turns on one of the constant-current switching element 22 and the first or second discharging switching element 32 or 36 while turning off the other thereof complementarily, thus alternately turning on and off the switching element S*#.

Specifically, the drive IC 40 turns on the constant-current switching element 22 in response to a rising edge of the corresponding drive signal g*# while turning off each of the first and second discharging switching elements 32 and 36. During a corresponding on duration of the drive signal g*#, the drive IC 40 keeps on the constant-current switching element 22 while keeping off each of the first and second discharging switching elements 32 and 36. In response to a falling edge of the corresponding drive signal g*#, the drive IC 40 turns off the constant-current switching element 22 while turning on each of the first and second discharging switching elements 32 and 36. During a corresponding off duration of the drive signal g*#, the drive IC 40 keeps off the constant-current switching element 22 while keeping on each of the first and second discharging switching elements 32 and 36.

The switching element S*# has a sense terminal St for outputting a minute current, referred to as a sense current, associated with a current, such as a collector current Ic, flowing through the conductive path between the collector and emitter thereof. The sense terminal St is connected to both the common potential line of the drive unit DU via the resistor 38 and the drive IC 40.

When a collector current Ic flows through the conductive path of the switching element S*#, a sense current associated with the collector current Ic flows through the resistor 38, causing a voltage drop across the resistor 38. The drive IC 40 measures the voltage drop across the resistor 38 as a sense voltage Vse, thus obtaining, according to the measured sense voltage Vse, a signal indicative of the magnitude of the collector current Ic flowing through the switching element S*#. That is, the level of the sense voltage Vse correlates with the magnitude of the collector current Ic flowing through the switching element S*#.

The drive IC 40 determines, based on the sense voltage Vse, whether the level of the collector current Ic flowing through the switching element S*# exceeds an allowable upper limit, the drive IC 40 forcibly turns off the constant-current switching element 22, and outputs a fail-safe signal FL to the interface 14.

The interface 14 is comprised of a fail-safe unit 14b illustrated in FIG. 1, and the fail-safe unit 14b shuts down each of the inverter INV and the converter CNV in response to the fail-safe signal FL.

An example of the structure of the fail-safe unit 14b is illustrated in FIG. 2.

Specifically, the fail-safe unit 14b is comprised of a set of a low-voltage power source 60, an active-low switching element 62, and a resistor 64 provided for each of the photocouplers 14a. The fail-safe unit 14b is also comprised of a photocoupler 70 for each switching element S*#, a low-voltage power source 72, a resistor 74, a comparator 76, resistors 78 and 80, and a NAND gate 82.

One end of the photodiode of each of the photocouplers 14a is connected to one end of the resistor 64 and the control unit 18, and the other end thereof is grounded. The other end of the resistor 64 is connected to the low-voltage power source 60 via the switching element 62. The control terminal of the switching element 62 is connected to an output terminal of the NAND gate 82. Each of the photocouplers 14a is ON if a low-voltage signal is inputted to a corresponding one of the switching elements 62 so that the photodiode is energized and the phototransistor is ON. Otherwise, each of the photocouplers 14a is OFF if a high-voltage signal is inputted to a corresponding one of the switching elements 62 so that the photodiode is de-energized and the phototransistor is OFF. While the photocoupler 14a is ON, information based on the drive signal g*# is input to the drive IC 40.

Each of the photocouplers 70 is comprised of a photodiode and a phototransistor. One end of the photodiode of each of the photocouplers is connected to the drive IC 40, and the other end thereof is grounded. The phototransistors of the respective photocouplers 70 are connected in series to constitute a series-connected photocoupler module. One end terminal of the series-connected photocoupler module is connected to the inverting input terminal of the comparator 76, and the other end terminal is grounded. The resistors 74 and 78 constitute a voltage divider that divides a voltage applied from the low-voltage source 72, and the divided voltage by the voltage divider is inputted to the non-inverting input terminal of the comparator 76. The low-voltage source 72 is also connected to the inverting input terminal of the comparator 76 via the resistor 80.

If no fail-safe signals FL are outputted from the drive IC 40, the inverting input terminal of the comparator 76 is grounded, so that a voltage signal with a low level is output from the comparator 76 to the control unit 18. In contrast, if a fail-safe signal FL for at least one switching element S*#, referred to as a target switching element S*#, is output from the drive IC 40, the photocoupler 70 for the target switching element S*# is turned off. The turnoff of the photocoupler 70 causes a voltage applied from the low-voltage battery 72 to the inverting input terminal of the comparator 76 to be higher than the divided voltage applied to the non-inverting input terminal of the comparator 76, resulting in inversion of the low level of the voltage signal outputted from the comparator 76 to a high level. The high-level voltage signal of the comparator 76 is sent to the control unit 18 and the NAND gate 82.

The NAND gate 82 has two input terminals, one of which is connected to the output terminal of the comparator 76, and the other thereof is connected to the control unit 18. Thus, the high-level voltage signal outputted from the comparator 76 is inputted to the control unit 18 as a fail-safe signal FL1.

The control unit 18 is operative to normally output a voltage signal having a high level to the NAND gate 82 via the other input terminal if the fail-safe signal FL1 is not input thereto. Thus, if no fail-safe signals FL are outputted from the drive IC 40 so that the high-level voltage signal is output from the comparator 76, a voltage signal having a low level is output from the NAND gate 82 to the control terminals of the active-low switching elements 62 provided for the respective switching elements S*#. Thus, the active-low switching elements 62 are turned on or kept on, so that the switching elements S*# are ON. That is, if no fail-safe signals FL are output from the drive IC 40, the switching elements S*# are ON.

In contrast, if a fail-safe signal FL for at least one switching element S*# is output from the drive IC 40 so that the low-level voltage signal is outputted from the comparator 76, a voltage signal having a high level is outputted from the NAND gate 82 to the control terminals of the active-low switching elements 62 provided for the respective switching elements S*#. Thus, the active-low switching elements 62 are turned off or kept off, so that all the switching elements S*# are OFF. That is, if at least one fail-safe signal FL is output from the drive IC 40, all the switching elements S*# are OFF, so that each of the inverter INV and converter CNV are shut down.

Note that, in order to shut down each of the inverter INV and converter CNV, it is preferable to use another discharging path between the gate of the switching element S*# and the common potential line; the discharging path has a resistance higher than each of the resistances R1 and R2 of the first and second discharging paths. For example, as illustrated in FIG. 2, the discharging path for the fail-safe shutdown, which is illustrated as DP, includes a switching element SW having an on-off control terminal connected to the drive IC 40. As described above, if at least one fail-safe signal FL is output from the drive IC 40, the controller 14 controls each of the drivers DU to turn on the switching element SW via the discharging path DP while keeping off each of the switching elements 22, 32, and 36. The turn-on of the switching element SW dissipates the charge stored in the gate of the switching element S*# via the discharging path DP, thus turning off the switching element S*#. As described above, the discharging path DP is higher in resistance than each of the first and second discharging paths. Thus, the turnoff speed of the switching element S*# via the discharging path DP in such an abnormal state is lower than that of the switching element S*# via each of the first and second discharging paths in the normal state. This reduction in the turnoff speed of the switching element S*# results in the suppression of a surge produced due to the turnoff of the switching element S*#.

In the first embodiment, when changing a switching element S*# from the on state to the off state in a next switching cycle, the drive IC 40 selectively turns on any one of the first discharging switching element 32 and the second discharging switching element 36 based on the amount of a current flowing through the switching element S*# while the IGBT is being in the on state in the current switching cycle. This changes the resistance of the discharging path for turning off the switching element S*# based on the amount of a collector current Ic flowing through the switching element S*#, thus performing the active gate control set forth above.

Next, a discharging-rate determining routine for a switching element S*# carried out by the drive IC 40 of each drive unit DU will be described hereinafter with reference to FIG. 3.

Figure 3:
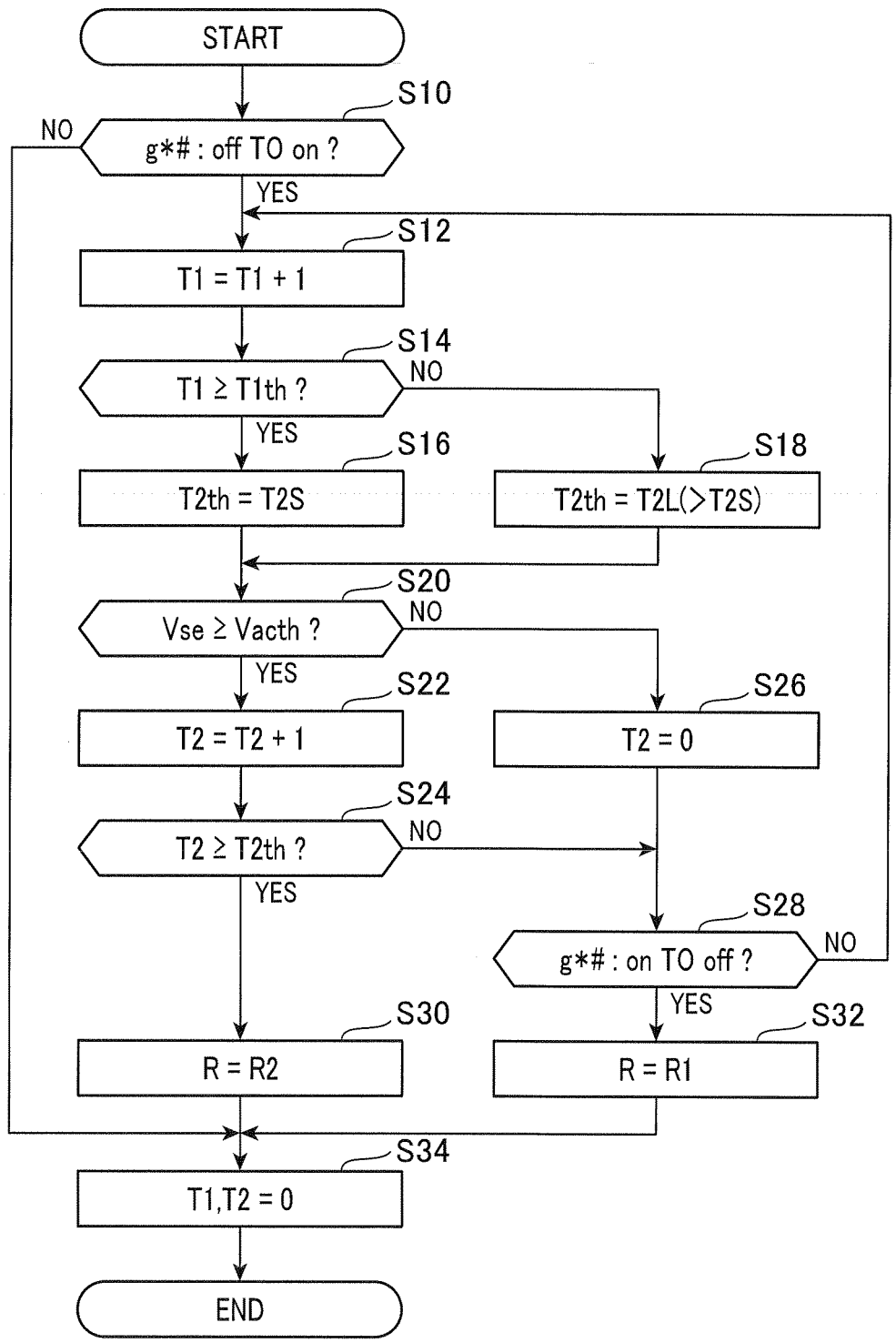
FIG. 3 is a flowchart schematically illustrating an example of a discharging-rate determining routine carried out by each drive unit of the control system illustrated in FIG. 1.

FIG. 3 is a flowchart schematically illustrating the discharging-rate determining routine. Note that the drive IC 40 of each drive unit DU can be configured as a programmed logic circuit, a hard-wired logic circuit, or the combination of hardwired-logic and programmed-logic hybrid circuits. For example, the drive IC 40 is configured to repeatedly carry out the discharging-rate determining routine while the drive unit DU is powered.

When a drive signal g*# is input to the drive IC 40, the drive IC 40 receives the drive signal g*# in step S10.

In step S10, the drive IC 40 determines whether the drive signal g*# is being shifted from the off state to the on state.

Upon determination that the drive signal g*# is being shifted from the off state to the on state (YES in step S10), the drive IC 40 carries out the operation in step S12. Specifically, in step S12, the drive IC 40 turns on the constant current switching element 22 in step S12. The turn-on of the constant-current switching element 22 starts charging the gate of the switching element S*#.

In step S12, the drive IC 40 also increments, by 1, a first counter T1, which is a hardware or software counter previously incorporated therein; an initial value of the first counter T1 is set to 0. The first counter T1 shows elapsed time since the shift of the drive signal g*# from the off state to the on state. The operation in step S12 serves as, for example, a first module configured to start measuring time T1 in response to the shift of the drive signal g*# from the off state to the on state.

Next, the drive IC 40 determines whether the first counter T1 is equal to or higher than a preset first threshold time value, i.e. a first threshold period, T1th in step S14. The operation in step S14 is to determine whether to reduce a second threshold time value, i.e. a second threshold period, T2th described later. The first threshold time value T1th is for example set based on time required until the sense voltage Vse is reduced to be stable while the collector current Ic is constant. The operation in step S14 serves as, for example, a second module configured to determine whether the predetermined period T1th has elapsed since the shift of the drive signal from the off state to the on state as a function of the measured time T1.

Upon determination that the first counter T1 is equal to or higher than the first threshold time value T1th (YES in step S14), the drive IC 40 sets the second threshold time value T2th to a short default value T2-S in step S16. Otherwise, upon determination that the first counter T1 is lower than the first threshold time value T1th (NO in step S14), the drive IC 40 sets the second threshold time value T2th to a long default value T2L higher than the short default value T2S in step S18. Specifically, time defined by the long default value T2L is longer than that defined by the short default value T2S.

Following the operation in step S16 or step S18, the drive IC 40 carries out the operation in step S20.

In step S20, the drive IC 40 determines whether the sense voltage Vse is equal to or higher than an active-gate threshold voltage Vacth. The operation in step S20 is to determine whether to use the second discharging switching element 36 for turning off the switching element S*#. Specifically, the higher the sense voltage Vse is, the higher the level of the collector current Ic flowing through the switching element S*# is. For this reason, if the level of the collector current Ic is high, using the first discharging switching element 32 to turn off the switching element S*# may cause an excessively high surge. For this reason, if the level of the collector current Ic is high, using the second discharging switching element 36 to turn off the switching element S*# may cause an excessively high surge. Thus, if the level of the collector current Ic is high, using the second discharging switching element 36 to turn off the switching element S*# makes it possible to prevent a surge based on the turnoff of the switching element S*# from being excessively high. Note that the active-gate threshold voltage Vacth is set to prevent a voltage applied across both the ends, i.e. the emitter and collector, of the conductive path of the switching element S*# from exceeding the breakdown voltage of the switching element S*# due to a surge produced by turnoff of the switching element S*#.

Upon determination that the sense voltage Vse is equal to or higher than the active-gate threshold voltage Vacth (YES in step S20), the drive IC 40 increments, by 1, a second counter T2, which is a hardware or software counter previously incorporated therein; an initial value of the second counter T2 is set to 0 in step S22. The second counter T2 shows the duration of the sense voltage Vse being equal to or higher than the active-gate threshold voltage Vacth. Otherwise, upon determination that the sense voltage Vse is lower than the active-gate threshold voltage Vacth (YES in step S20), the drive IC 40 resets the second counter T2 to zero in step S26.

After completion of the operation in step S22, the drive IC 40 determines whether the second counter T2 is equal to or higher than the second threshold time value T2th set forth above in step S24. The operation in step S24 is to determine whether to use the second discharging switching element 36.

Note that the condition that the second counter T2 is equal to or higher than the second threshold time T2th serves as a condition to execute reduction of the discharging rate of the switching element S*#, which will be referred to as execution condition hereinafter. The execution condition is provided in the discharging-rate determining routine for avoiding erroneous selection of the second discharging switching element 36 for discharging the gate of the switching element S*#.

Specifically, there is a risk that the sense voltage Vse momentarily exceeds, due to noise, the active-gate threshold voltage Vacth after lapse of the first threshold time value T1th. In this situation, if the affirmative determination in step S20 were used as the execution condition, there could be a risk that the second discharging switching element 36 was improperly used. On the other hand, before lapse of the first threshold time value T1th, the determination in step S20 is likely to be affirmative although the collector current Ic is actually low. Thus, if the affirmative determination in step S20 were used as the execution condition, there could be a risk that the second discharging switching element 36 was improperly used.

Accordingly, the drive IC 40 according to the first embodiment is configured to use the determination that the second counter T2 is equal to or higher than the second threshold time value T2th as the execution condition.

In the first embodiment, the operations in steps S12, S14, S16, and S18 serve as, for example, a loosening module M1, which can be constructed by a hardware, software, or a hardware/software hybrid circuit, is illustrated in FIG. 2. The loosening module M1 is configured to loosen the execution condition after the lapse of the predetermined period T1th since the shift of the drive signal from the off state to the on state in comparison to the execution condition immediately after the shift of the drive signal from the off state to the on state.

For example, loosening the execution condition after the lapse of the predetermined period T1th since the shift of the drive signal from the off state to the on state in comparison to the execution condition immediately after the shift of the drive signal from the off state to the on state includes making the execution condition being met easier after the lapse of the predetermined period T1th since the shift of the drive signal from the off state to the on state than immediately after the shift of the drive signal from the off state to the on state.

Upon determination that the second counter T2 is lower than the second threshold time value T2th (NO in step S24), the drive IC 40 performs the operation in step S28. In step S28, the drive IC 40 determines whether the drive signal g*# is being shifted from the on state to the off state.

Upon determination that the drive signal g*# is not being shifted from the on state to the off state (NO in step S28), the drive IC 40 returns to the operation in step S12, and repeatedly carries out the operations from step S12.

Otherwise, upon determination that the drive signal g*# is being shifted from the on state to the off state (YES in step S28), the drive IC 40 determines to use the first discharging switching element 32 for turning off the switching element S*# in step S32. Specifically, the drive IC 40 selects the impedance of the discharging path for the gate of the switching element to the resistance R1 of the first discharging path including the first discharging resistor 30.

On the other hand, upon determination that the second counter T2 is equal to or higher than the second threshold time value T2th (YES in step S24), the drive IC 40 performs the operation in step S30. In step S30, the drive IC 40 determines to use the second discharging switching element 36 for turning off the switching element S*#. Specifically, the drive IC 40 turns on the second discharging switching element 36 while turning off the first discharging switching element 32, thus selecting the impedance of the discharging path for the gate of the switching element S*# to the resistance R2 from the resistance R1. This reduces the discharging-rate of the switching element S*# because the resistance R2 is higher than the resistance R1.

After completion of the operation in step S30 or step S32, the drive IC 40 resets each of the first and second counters T1 and t2 to zero in step S34, and terminates the discharging-rate determining routine. In addition, upon determination that the drive signal g*# is not being shifted from the off state to the on state (NO in step S10), the drive IC 40 resets each of the first and second counters T1 and t2 to zero in step S34, and terminates the discharging-rate determining routine.

The operations in steps S20, S22, S24, and S30 serve as, for example, a changing module M2, which can be constructed by a hardware, software, or a hardware/software hybrid circuit, is illustrated in FIG. 2. The changing module M2 is configured to:

determine whether the execution condition including the level of the sense signal being higher than the threshold level Vacth during the on state of the drive signal; and change the discharging rate of the gate of the switching element S*# as a function of the level of the sense signal in response to the drive signal g*# being shifted from the off state to the on state.

When viewing the operations of the discharging-rate determining routine illustrated in FIG. 3 from another aspect, the operations in steps S20, S22, and S24 serve as, for example, a determining module M3, and the operations in steps S12 and S14 serve as, for example, a disabling module M4. In another aspect, the operations in step S30 serves as, for example, a discharging-rate changing module M5. Each of the modules M3 to M5 can be constructed by a hardware, software, or a hardware/software hybrid circuit, is illustrated in FIG. 2.

The determining module M3 is configured to determine whether an execution condition that the duration T2 of the level of the sense signal Vse being higher than the threshold level Vacth is equal to or longer than the threshold time T2th is met.

The disabling module M4 is configured to disable the determining module M3 from executing the determination until the predetermined period T1th has elapsed since the shift of the drive signal g*3 from the off state to the on state.

The discharging-rate changing module M5 is configured to change the discharging rate of the gate of the switching element S*# when it is determined that by the determining module that the execution condition is met (see the affirmative determination in step S24 and the operation in step S30).

Figure 4:
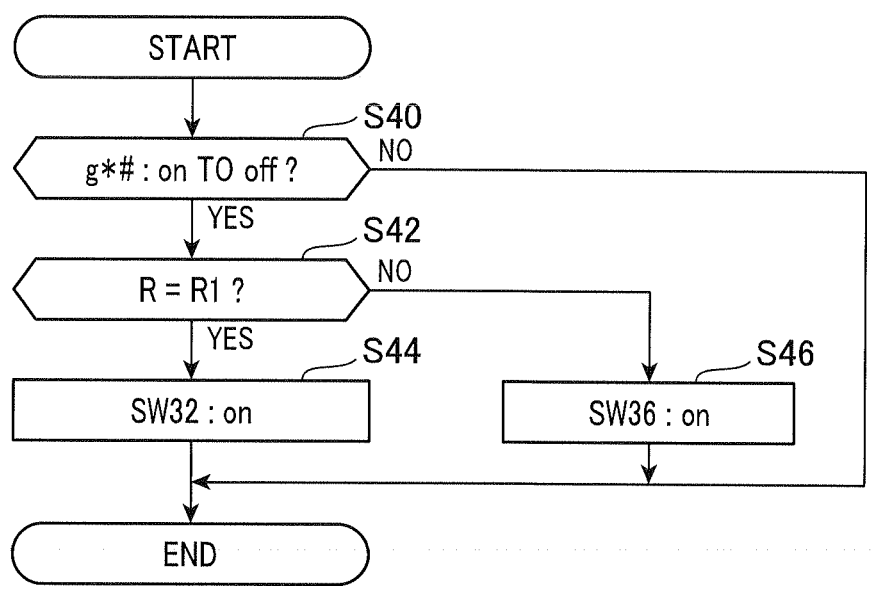
FIG. 4 is a flowchart schematically illustrating an example of a turnoff routine carried out by each drive unit of the control system illustrated in FIG. 1.

FIG. 4 is a flowchart schematically illustrating a turnoff routine for a switching element S*# carried out by the drive IC 40 of each drive unit DU using a discharging module according to the first embodiment. In the first embodiment, the discharging module is, for example, operative to discharge, at a predetermined discharging rate, the gate of the switching element S*# for changing the switching element S*# from the on state to the off state in response to the drive signal being shifted from the on state to the off state. For example, the discharging module includes the first discharging resistor 30, the first discharging switching element 32, the second discharging resistor 34, and the second discharging switching element 36. For example, the drive IC 40 is configured to repeatedly carry out the turnoff routine while the drive unit DU is powered.

When a drive signal g*# is input to the drive IC 40, the drive IC 40 receives the drive signal g*# in step S40.

In step S40, the drive IC 40 determines whether the drive signal g*# is being shifted from the on state to the off state.

Upon determination that the drive signal g*# is being shifted from the on state to the off state (YES in step S40), the drive IC 40 carries out the operation in step S42. Specifically, in step S42, the drive IC 40 determines whether the first discharging path based on the first discharging resistor 30 has been selected as the discharging path of the gate of the switching element S*#.

Upon determination that the first discharging path based on the first discharging resistor 30 has been selected as the discharging path of the gate of the switching element S*# (YES in step S42), the drive IC 40 turns on the first discharging switching element 32 in step S44.

Otherwise, upon determination that the second discharging path based on the second discharging resistor 34 has been selected as the discharging path of the gate of the switching element S*# (NO in step S42), the drive IC 40 turns on the second discharging switching element 36 in step S46.

After completion of the operation in step S44 or step S46, the drive IC 40 terminates the turnoff routine. In addition, upon determination that the drive signal g*# is not being shifted from the on state to the off state (NO in step S40), the drive IC 40 terminates the turnoff routine.

That is, the discharging-rate determining routine and the turnoff routine serve as a routine that causes the drive IC 40 of each drive unit DU to execute the active gate control for a corresponding switching element S*#.

Figure 5:
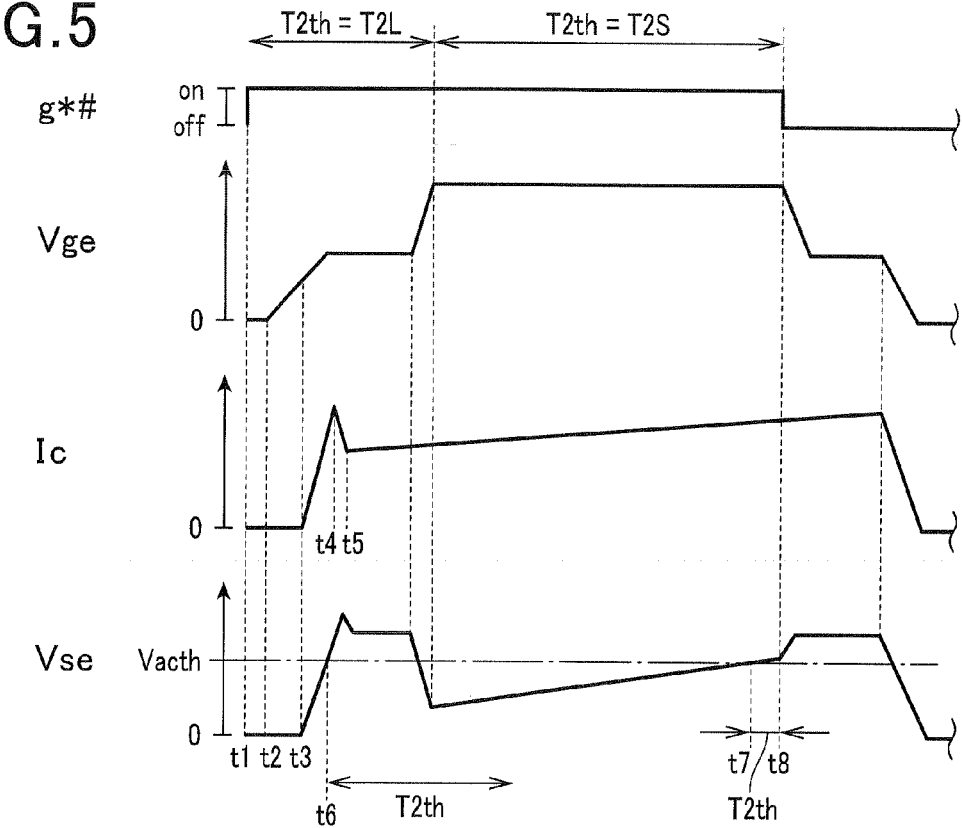
FIG. 5 is a timing chart schematically illustrating how parameters showing operations of active gate control carried out by each drive unit vary during execution of the active gate control according to the first embodiment.

FIG. 5 schematically illustrates how parameters showing operations of the active gate control vary during execution of the active gate control. The parameters include the drive signal g*#, a gate voltage Vge at the gate of the switching element S*#, the collector current Ic, and the sense voltage Vse. The gate voltage Vge shows the absolute value of the potential difference between the gate and emitter of the switching element S*#.

Referring to FIG. 5, when the drive signal g*# is being shifted from the off state to the on state at time t1, the constant current switching element 22 is turned on at the time t1. The turn-on of the constant-current switching element 22 starts increasing the gate voltage Vge based on the potential difference Vc across the constant-current resistor 24 at time t2. The increase in the gate voltage Vge causes the collector current Ic to increase (see time t3).

Referring to FIG. 5, the gate voltage Vge rises up to a Miller voltage Vm, and thereafter, remains at the Miller voltage for a Miller period in order to charge the gate-drain capacitance. Thereafter, the gate voltage Vge rises up to its upper limit.

Note that the variation of the waveform of the collector current Ic shows that the collector current Ic abruptly rises (see time t4), and thereafter, slightly falls (see time t5). Assuming that the switching element S*# is one of the high- and low-side switching element of one phase, the variation of the collector current Ic is caused by a recovery current flowing through the diode D*p or D*n connected in antiparallel to the other of the high- and low-side switching element S*p and S*n of the same phase.

The level of the collector current Ic within the period during which the recovery current is flowing is unsuitable for use as a value to which the drive IC 40 refers for determining the impedance of the discharging path under the active gate control.

In addition, after stop of the flow of the recovery current, the variation of the waveform of the collector current Ic shows that the collector current Ic gradually rises.

Due to the recovery current, a surge is produced across the flywheel diode and the other of the switching elements S*p and S*n. The surge is superimposed on the sense voltage Vse of the one of the switching elements S*p and S*n via parasitic capacitance between the emitter and collector of the one of the switching elements S*p and S*n. This superimposition results in a spike of the sense voltage Vse, and the spike of the sense voltage Vse exceeds the active-gate threshold voltage Vacth at time t6.

As illustrated in FIG. 5, while the gate voltage Vm remains at the Miller voltage Vm after stop of the recovery current, the level of the sense voltage Vm is kept at a higher value relative to the level of the collector current Ic. This is because the gate voltage Vm remains at the Miller voltage Vm.

Thus, the drive IC 40 according to the first embodiment establishes the second threshold time value T2th serving as a disabling period, i.e. a masking period. The disabling period means a period during which the change of the impedance of the discharging path for the gate of the switching element S*# from the low impedance, i.e. the resistance R1, to the high impedance, i.e. the resistance R2, is disabled. In other words, the long default value T2L of the second threshold time value T2th is set such that the lapse of the long default value T2L of the second threshold time value T2th results in the sense voltage Vse, which exceeded the active-gate threshold voltage Vacth, being equal to or lower than the active-gate threshold voltage Vacth. Thus, it is possible to avoid the impedance of the discharging path of the switching element S*# under the active gate control being set to an improper value due to the gate voltage Vge remaining at the Miller voltage Vm.

Thereafter, the sense voltage Vse rises with increase in the collector current Ic, so that the sense voltage Vse exceeds the active-gate threshold voltage Vatch at time t7. Thereafter, when the counted time T2 during which the sense voltage Vse is equal to or higher than the active-gate threshold voltage Vacth becomes equal to or higher than the short default value T2S of the second threshold time value T2th, the impedance of the discharging path under the active gate control is determined to the high impedance of the resistance R2 at time t8. As described above, the second threshold time value T2th has been changed from the long default value T2L to the short default value T2S because of the lapse of the first threshold time value T1th since the shift of the drive signal g*# from the off state to the on state.

For this reason, even if the drive signal g*# is shifted from the on state to the off state shortly after the sense voltage Vse becomes equal to or higher than the active-gate threshold voltage Vacth, it is possible to determine the impedance of the discharging path under the active gate control to a proper value. This results in elimination of the need for the active-gate threshold voltage Vacth to have a large margin, thus setting the active-gate threshold voltage Vacth to a value as high as possible.

Next, technical effects achieved by the drive unit DU according to the first embodiment will be described with reference to FIGS. 6A and 6B.

Figure 6A:
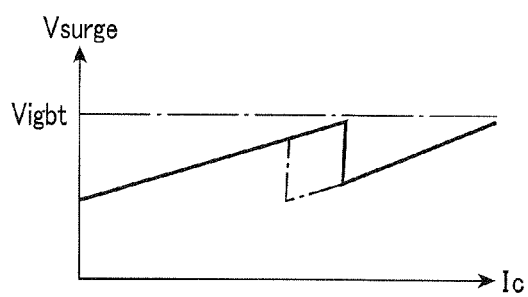
FIG. 6A is a view schematically illustrating, as graphs, the relationship between collector current and voltage applied to a switching element by turnoff of the switching element relative to a breakdown voltage of the switching element according to the first embodiment.

FIG. 6A schematically illustrates, as graphs, the relationship between collector current Ic and voltage Vsurge applied to a switching element S*# by turnoff of the switching element S*#, and the relationship between the graphs and breakdown voltage Vigbt of the switching element S*#. In FIG. 6A, the solid line graph, which was obtained by the drive unit DU according to the first embodiment, demonstrates that the applied voltage Vsurge decreases immediately before it reaches the breakdown voltage Vigbt. Increasing the impedance of the discharging path of the switching element S*# under the active gate control reduces the applied voltage Vsurge illustrated in FIG. 6A.

In contrast, the dash-dot line graph, which was obtained by a known drive unit that uses a fixed time value as the second threshold time value T2th, is illustrated in FIG. 6A. As described above, the second threshold time value T2th is set to the fixed time value. For this reason, in order to reliably increase the impedance of the discharging path of the switching element S*# if the level of the collector current Ic is equal to or higher than a current level corresponding to the active-gate threshold voltage Vacth according to the first embodiment, it is necessary to set the active-gate threshold voltage Vacth to a value lower than the value of the active-gate threshold voltage Vacth according to the first embodiment. Thus, the dash-dot line graph demonstrates that the impedance of the discharging path is increased while maintaining the sense voltage Vse has a given margin relative to the breakdown voltage Vigbt.

Figure 6B:
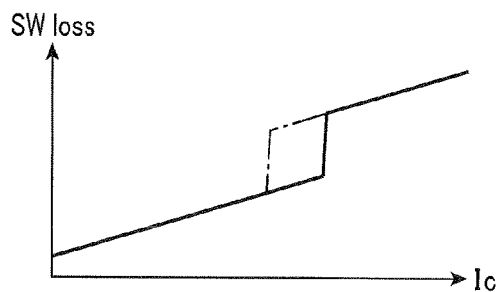
FIG. 6B is a view schematically illustrating, as graphs, the relationship between the collector current flowing through the switching element and switching loss in the corresponding drive unit according to the first embodiment.

Specifically, FIG. 6B illustrates a solid-line graph showing the relationship between collector current Ic flowing through the switching element S*# and switching loss in the drive unit DU according to the first embodiment. FIG. 6B also illustrates a dash-dot line graph showing the relationship between collector current Ic flowing through the switching element S*# and switching loss in the known drive unit.

FIG. 6B demonstrates reduction of switching loss in the known drive unit in comparison to switching loss in the drive unit DU according to the first embodiment.

As described above, the drive unit DU for each switching element S*# according to the first embodiment is configured to relax, i.e. loosen, the execution condition for the switching element S*# after the lapse of the first threshold time value T1th since the shift of the drive signal g*# from the off state to the on state in comparison to the execution condition therefor immediately after the shift of the drive signal g*# from the off state to the on state.

Specifically, this configuration makes shorter the length of the second threshold period T2th after the lapse of the first threshold time value T1th since the shift of the drive signal g*# from the off state to the on state than immediately after the shift of the drive signal g*# from the off state to the on state.

This configuration achieves a first effect of reliably executing reduction of the discharging rate of the switching element S*# while avoiding, before the gate voltage Vge sufficiently increases up to a steady-state level Vst as an upper limit thereof, reduction of the discharging rate of the switching element S*# due to the level of the sense voltage Vm being high relative to the level of the collector current Ic.

The drive unit DU for each switching element S*# according to the first embodiment is also configured to disable the change of the impedance of the discharging path for the gate of the switching element S*# from the low impedance to the high impedance while the drive signal g*# is being in the off state. This configuration achieves a second effect of avoiding the impedance of the discharging path of the switching element S*# under the active gate control being set to an improper value due to the gate voltage Vge while the drive signal g*# is being in the off state.

The drive unit DU for each switching element S*# according to the first embodiment is further configured to reduce the second threshold time value T2th to thereby loosen the execution condition for the switching element S*#. This configuration achieves a third effect of easily loosening the execution condition for the switching element S*#.

In addition, the drive unit DU for each switching element S*# according to the first embodiment is configured to:
start measuring elapsed time since the shift of the drive signal g*# from the off state to the on state as the first counter T1; and
loosen the execution condition for the switching element S*# when the measured elapsed time becomes equal to or higher than the first threshold time value T1th.

This configuration achieves a fourth effect of properly determining the loosening timing of the execution condition.

Second Embodiment

A control system for controlling the motor-generator 10 according to a second embodiment of the present disclosure will be described with reference to FIG. 7.

The structure and/or functions of the control system according to the second embodiment are mainly identical to those of the control system according to the first embodiment except for the following points. So, the different points will be mainly described hereinafter.

A second discharging-rate determining routine for a switching element S*# according to the second embodiment is configured to determine the execution condition as a function of the length of duration of the sense voltage Vse being equal to or higher than the active-gate threshold voltage Vacth while the drive signal g*# is in the off state.

FIG. 7 is a flowchart schematically illustrating the second discharging-rate determining routine for a switching element S*# carried out by the drive IC 40 of each drive unit DU according to the second embodiment.

Note that discharging-rate determining routine illustrated in FIG. 3 and the second discharging-rate determining routine illustrated in FIG. 7 are both repeatedly carried out by the drive IC 40 of each drive unit DU.

As illustrated in FIG. 7, in step S50, the drive IC 40 determines whether the drive signal g*# is being shifted from the on state to the off state.

Upon determination that the drive signal g*# is being shifted from the on state to the off state (YES in step S50), the drive IC 40 determines whether the sense voltage Vse is equal to or higher than the active-gate threshold voltage Vacth in step S52.

Upon determination that the sense voltage Vse is equal to or higher than the active-gate threshold voltage Vacth (YES in step S52), the drive IC 40 increments, by 1, a third counter T3, which is a hardware or software counter previously incorporated therein; an initial value of the third counter T3 is set to 0. The third counter T3 shows the duration of the sense voltage Vse being equal to or higher than the active-gate threshold voltage Vacth.

Otherwise, upon determination that the sense voltage Vse is lower than the active-gate threshold voltage Vacth (NO in step S52), the drive IC 40 resets the third counter T3 to zero in step S56.

After completion of the operation in step S54, the drive IC 40 determines whether the third counter T3 is equal to or higher than a third threshold time value T3th in step S58. The operation in step S58 is to determine whether to increase the impedance of the discharging path of the switching element S*# under the active gate control. The third threshold time value T3th is set to be longer than the short default value T2S. This setting of the third threshold value T3th tightens the execution condition while the drive signal g*# is in the off state in comparison to the execution condition after the first threshold time value T1th since the shift of the drive signal g*# from the off state to the on state according to the first embodiment. Specifically, this setting of the third threshold value T3th disables change of the impedance of the discharging path of the switching element S*# under the active gate control while the drive signal g*# is in the off state. In order to reliably disable the impedance change, the third threshold time value T3th is set to be an expected minimum time value during which the drive signal g*# is in the off state.

Upon determination that the third counter T3 is lower than the third threshold time value T3th (NO in step S58), the drive IC 40 performs the operation in step S60. In step S60, the drive IC 40 determines whether the drive signal g*# is being shifted from the off state to the on state.

Upon determination that the drive signal g*# is not being shifted from the off state to the on state (NO in step S60), the drive IC 40 returns to the operation in step S52, and repeatedly carries out the operations from step S52.

On the other hand, upon determination that the third counter T3 is equal to or higher than the third threshold time value T3th (YES in step S58), the drive IC 40 performs the operation in step S62. In step S62, the drive IC 40 determines to use the second discharging switching element 36 for turning off the switching element S*#. Specifically, the drive IC 40 selects the impedance of the discharging path for the gate of the switching element to the resistance R2 of the second discharging path including the second discharging resistor 34.

After completion of the operation in step S62, or upon determination that the drive signal g*# is being shifted from the off state to the on state (YES in step S60), the drive IC 40 resets the third counter T3 to zero in step S64, and terminates the discharging-rate determining routine. In addition, upon determination that the drive signal g*# is not being shifted from the on state to the off state (NO in step S50), the drive IC 40 resets the third counter T3 to zero in step S64, and terminates the discharging-rate determining routine.

As described above, the drive unit DU for each switching element S*# according to the second embodiment is configured to perform both the discharging-rate determining routine illustrated in FIG. 3 and the second discharging-rate determining routine illustrated in FIG. 7, which determines the impedance of the discharging path of the switching element S*# based on duration of the sense voltage Vse being equal to or higher than the active-gate threshold voltage Vacth. Thus, the drive unit DU for each switching element S*# according to the second embodiment determines the impedance of the impedance of the discharging path of the switching element S*# independently of whether the drive signal g*# is in the on state or the off state.

Third Embodiment

A control system for controlling the motor-generator 10 according to a third embodiment of the present disclosure will be described with reference to FIG. 8.

The structure and/or functions of the control system according to the third embodiment are mainly identical to those of the control system according to the first embodiment except for the following points. So, the different points will be mainly described hereinafter.

Figure 8:
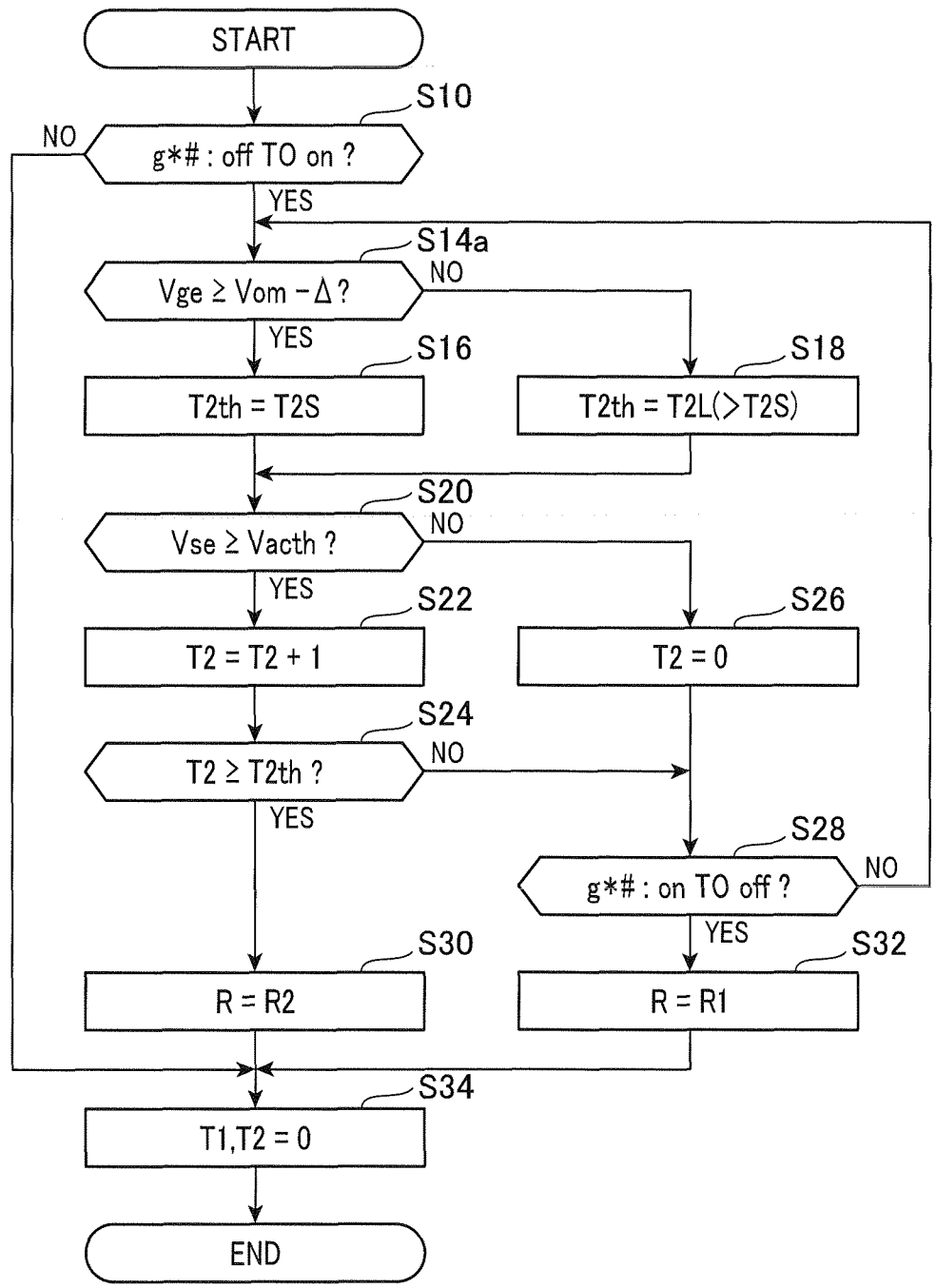
FIG. 8 is a flowchart schematically illustrating an example of a third discharging-rate determining routine carried out by each drive unit of the control system according to a third embodiment of the present disclosure.

FIG. 8 is a flowchart schematically illustrating a third discharging-rate determining routine for a switching element S*# carried out by the drive IC 40 of each drive unit DU according to the third embodiment. In the third discharging-rate determining routine according to the third embodiment, like steps to the discharging-rate determining routine according to the first embodiment, to which like step numbers are assigned, are omitted or simplified to avoid redundant description. For example, the drive IC 40 is configured to repeatedly carry out the third discharging-rate determining routine in place of the discharging-rate determining routine illustrated in FIG. 3 while the drive unit DU is powered.

Referring to FIG. 8, upon determination that the drive signal g*# is being shifted from the off state to the on state (YES in step S10), the drive IC 40 performs the operation in step S14a.

In step S14a, the drive IC 40 determines whether the gate voltage Vge is equal to or higher than the subtraction of a preset margin level Δ from the terminal voltage Vom of the voltage source 20 in step S14a; the subtraction can be expressed as "Vom−Δ". The operation in step S14a is to determine whether the gate voltage Vge has reached the steady-state level Vst.

Upon determination that the gate voltage Vge is equal to or higher than the subtraction of the preset margin level Δ from the terminal voltage Vom of the voltage source 20 (YES in step S14a), the drive IV 40 carries out the operation in step S16 set forth above. Otherwise, upon determination that the gate voltage Vge is lower than the subtraction of the preset margin level Δ from the terminal voltage Vom of the voltage source 20 (NO in step S14a), the drive IV 40 carries out the operation in step S18 set forth above.

In the third embodiment, the operations in steps S14a, S16, and S18 serve as, for example, the loosening module M1 illustrated in FIG. 2. The loosening module M1 according to the third embodiment is configured to determine the lapse of the predetermined period T1th since the shift of the drive signal from the off state to the on state when the gate voltage Vge is equal to or higher than the subtraction of the preset margin level Δ from the terminal voltage Vom of the voltage source 20.

As described above, the drive unit DU for each switching element S*# according to the third embodiment is configured to increase the probability that the condition is met if the gate voltage Vge is equal to or higher than a value k; the value k is defined by the following equation k=Vom−Δ. This configuration achieves, in addition to the first to third effects, a fifth effect of reliably disabling increase of the probability that the condition is met while the level of the sense voltage Vse is high relative to the level of the collector current Ic.

Fourth Embodiment

A control system for controlling the motor-generator 10 according to a fourth embodiment of the present disclosure will be described with reference to FIGS. 9A and 9B.

The structure and/or functions of the control system according to the fourth embodiment are mainly identical to those of the control system according to the first embodiment except for the following points. So, the different points will be mainly described hereinafter.

Figure 9A:
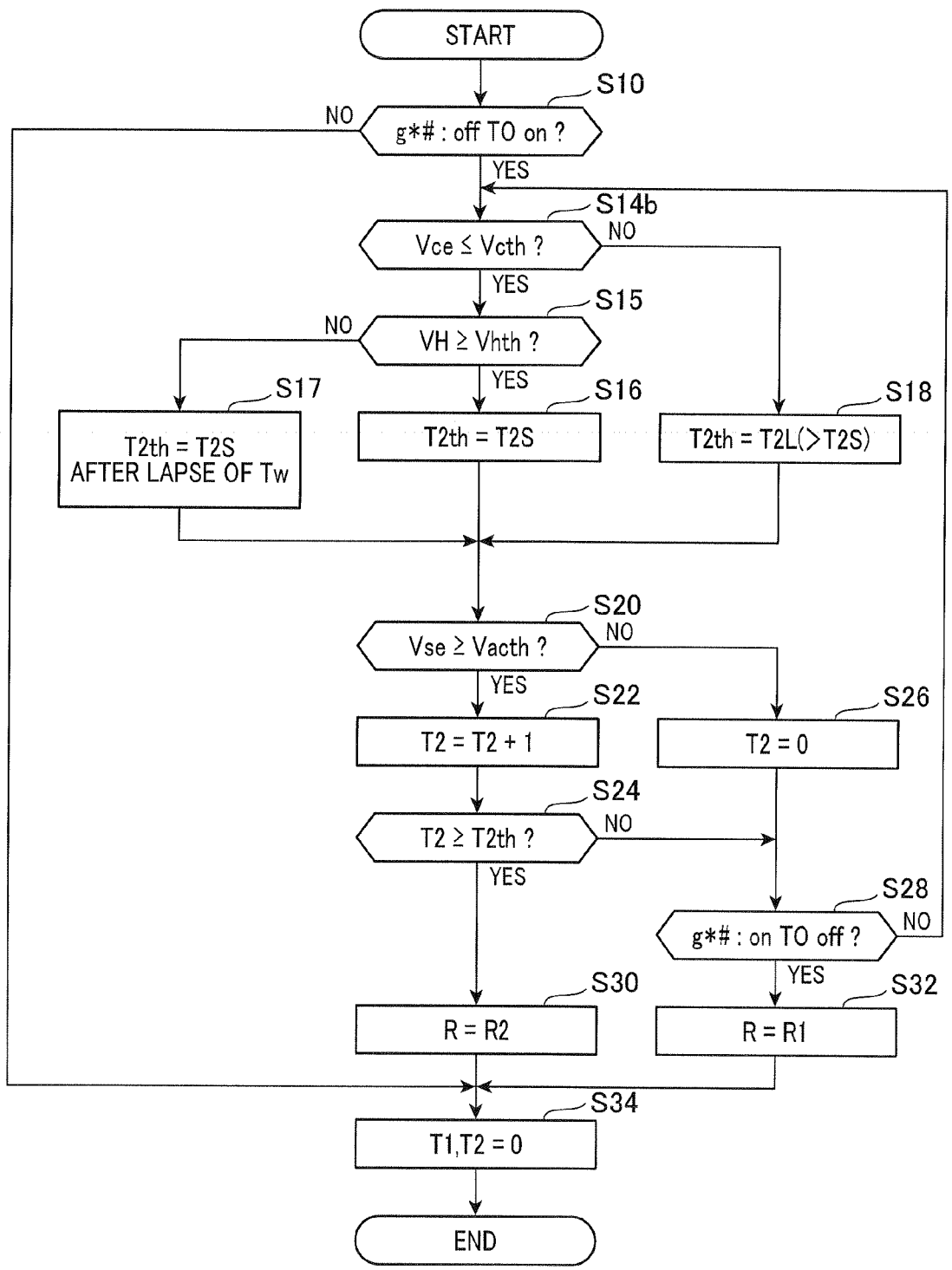
FIG. 9A is a flowchart schematically illustrating an example of a fourth discharging-rate determining routine carried out by each drive unit of the control system according to a fourth embodiment of the present disclosure.

FIG. 9A is a flowchart schematically illustrating a fourth discharging-rate determining routine for a switching element S*# carried out by the drive IC 40 of each drive unit DU according to the fourth embodiment. In the fourth discharging-rate determining routine according to the third embodiment, like steps to the discharging-rate determining routine according to the first embodiment, to which like step numbers are assigned, are omitted or simplified to avoid redundant description. For example, the drive IC 40 is configured to repeatedly carry out the third discharging-rate determining routine in place of the discharging-rate determining routine illustrated in FIG. 3 while the drive unit DU is powered.

Referring to FIG. 9A, upon determination that the drive signal g*# is being shifted from the off state to the on state (YES in step S10), the drive IC 40 performs the operation in step S14b.

In step S14b, the drive IC 40 determines whether the collector-emitter voltage Vce of the switching element S*# is equal to or lower than a threshold voltage Vcth. The threshold voltage Vcth is set to be close to the lower limit of the collector-emitter voltage Vce. The collector-emitter voltage Vce shows the absolute value of the potential difference between the collector and emitter of the switching element S*#.

Upon determination that the collector-emitter voltage Vce is equal to or lower than the threshold voltage Vcth (YES in step S14b), the drive IC 40 determines whether the input voltage VH to the inverter INV is equal to or higher than a threshold voltage Vhth in step S15.

Upon determination that the input voltage VH to the inverter INV is equal to or higher than the threshold voltage Vhth (YES in step S15), the drive IC 40 sets the second threshold time value T2th to a short default value T2S, thus loosening the execution condition in step S16.

Otherwise, upon determination that the input voltage VH to the inverter INV is lower than the threshold voltage Vhth (NO in step S15), the drive IC 40 waits until a preset time Tw has elapsed since the collector-emitter voltage Vce was equal to or lower than the threshold voltage Vcth in step S17. After the lapse of the preset time Tw since the collector-emitter voltage Vce was equal to or lower than the threshold voltage Vcth, the drive IC 40 sets the second threshold time value T2th to a short default value T2S, thus loosening the execution condition in step S17.

Otherwise, upon determination that the collector-emitter voltage Vce is higher than the threshold voltage Vcth (NO in step S14b), the drive IC 40 sets the second threshold time value T2th to the long default value T2L higher than the short default value T2S in step S18.

If the input voltage VH to the inverter INV is equal to or higher than the threshold voltage Vhth, the collector-emitter voltage Vce decreases as the gate-emitter voltage Vge increases. Specifically, the collector-emitter voltage Vce falls down to a preset middle voltage, and thereafter is kept at the preset middle voltage for a period corresponding to the Miller period. Thereafter, the collector-emitter voltage Vce falls down to its lower limit (see the upper side of FIG. 9B) as the gate voltage Vge rises up to the steady-state level Vst. Thus, the sense voltage Vse is determined to be lower than the Vacth.

Thus, as illustrated in the upper side of FIG. 9B, the condition whether the collector-emitter voltage Vce is equal to or lower than the threshold voltage Vcth can be used as the condition whether the first counter T1 is equal to or higher than the first threshold time value T1th.

On the other hand, if the input voltage VH to the inverter INV is lower than the threshold voltage Vhth, the timing when the collector-emitter voltage Vce becomes equal to or lower than the threshold voltage Vcth is highly earlier than the timing when the gate voltage Vge rises up to the steady-state value Vst during the on state of the switching element S*# (see the lower side of FIG. 9B).

Specifically, if the switching element S*p or S*n is switched to the on state, a voltage is induced in the corresponding winding as a back electromotive force to prevent reduction of a current flowing through the DC input line of the inverter INV. That is, the induced voltage has the polarity opposite to the polarity of the input voltage VH to the inverter INV. For this reason, when the switching signal g*# is shifted from the off state to the on state, the collector-emitter voltage Vce of the switching element S*# is lower than the input voltage VH to the inverter INV. Particularly, if the input voltage VH to the inverter INV is lower than the threshold voltage Vhth, the collector-emitter voltage Vce rapidly falls to be lower than the threshold voltage Vcth without being kept at the middle voltage although the collector current Ice is actually low.

Thus, while the input voltage VH to the inverter INV is lower than the threshold voltage Vhth, if the affirmative determination in step S14b were used as the execution condition, there could be a risk that the second discharging switching element 36 was improperly used.

Thus, the drive IC 40 according to the fourth embodiment is configured to use both the determination that the collector-emitter voltage Vce is equal to or lower than the threshold voltage Vcth and the determination that the input voltage VH to the inverter INV is equal to or higher than the threshold voltage Vhth as the execution condition.

If the determination in step S14b is affirmative while the input voltage VH to the inverter INV is lower than the threshold voltage Vhth, the drive IC 40 disables change of the impedance of the discharging path of the switching element S*# under the active gate control until the preset time Tw has elapsed since the arrive of the collector-emitter voltage Vce at the threshold voltage Vcth (see the lower side of FIG. 9B). The preset time Tw is obtained such that, after lapse of the preset time Tw since the arrive of the collector-emitter voltage Vce at the threshold voltage Vcth, the sense voltage Vse has been estimated to be lower than the Vacth.

Accordingly, the drive IC 40 can use the collector-emitter voltage Vce and the input voltage VH to the inverter INV to determine whether to change the impedance of the discharging path of the switching element S*#.

In the fourth embodiment, the operations in steps S14b, S15, S16, S17, and S18 serve as, for example, the loosening module M1 illustrated in FIG. 2. The loosening module M1 according to the fourth embodiment is configured to:

compare the absolute value of the potential difference between the first and second ends of the conductive path of the switching element S*# with the threshold voltage Vcth; and determine the lapse of the predetermined period T1th since the shift of the drive signal from the off state to the on state after determination that, based on the result of the comparison, the absolute value of the potential difference between the first and second ends of the conductive path of the switching element S*# is lower than the threshold voltage Vcth.

As described above, the drive unit DU for each switching element S*# according to the fourth embodiment is configured to determine to relax the execution condition based on whether the collector-emitter voltage Vce of the switching element S*# is equal to or lower than the threshold voltage Vcth. Because the collector-emitter voltage Vce decrease as an increase in the gate voltage Vge, this configuration achieves, in addition to the first to third effects, a sixth effect of reliably avoiding relaxation of the execution condition while the level of the sense voltage Vse is high relative to the level of the collector current Ic.

Fifth Embodiment

A control system for controlling the motor-generator 10 according to a fifth embodiment of the present disclosure will be described with reference to FIG. 10.

The structure and/or functions of the control system according to the fifth embodiment are mainly identical to those of the control system according to the first embodiment except for the following points. So, the different points will be mainly described hereinafter.

FIG. 10 is a flowchart schematically illustrating a fifth discharging-rate determining routine for a switching element S*# carried out by the drive IC 40 of each drive unit DU according to the fifth embodiment. In the fifth discharging-rate determining routine according to the fifth embodiment, like steps to the discharging-rate determining routine according to the first embodiment, to which like step numbers are assigned, are omitted or simplified to avoid redundant description. For example, the drive IC 40 is configured to repeatedly carry out the fifth discharging-rate determining routine in place of the discharging-rate determining routine illustrated in FIG. 3 while the drive unit DU is powered.

Referring to FIG. 10, upon determination that the first counter T1 is lower than the first threshold time value T1th (NO in step S14), the drive IC 40 returns to the operation in step S12 without execution of the operation in step S18, and repeatedly carries out the operations from step S12.

This configuration of the fifth discharging-rate determining routine permits execution of the operation in step S20 only after lapse of the first threshold time value T1th since the shift of the drive signal g*# from the off state to the on state. In other words, after the lapse of the first threshold time value T1th since the shift of the drive signal g*# from the off state to the on state, it is possible to execute the operation in step S20 without execution of the determination in step S14.

Specifically, in the fifth embodiment, the operations in steps S12 and S14 serve as, for example, the loosening module M1 illustrated in FIG. 2. The loosening module M1 according to the fifth embodiment is configured to loosen the execution condition including the affirmative determination in each of step S14 and S20 after the lapse of the predetermined period T1th since the shift of the drive signal from the off state to the on state in comparison to the timing immediately after the shift of the drive signal from the off state to the on state.

Specifically, this configuration permits, after the lapse of the predetermined period T1th since the shift of the drive signal from the off state to the on state, the determination in step S14 to be unconditionally met. Thus, this configuration loosens the execution condition after the lapse of the predetermined period T1th since the shift of the drive signal from the off state to the on state in comparison to the timing immediately after the shift of the drive signal from the off state to the on state.

The configuration of the drive unit DU for each switching element S*# according to the fifth embodiment makes it possible to fix the second threshold time value T2th to the short default value T2S.

The drive units DU and the control system according to each of the first to fifth embodiments can be modified.

The drive IC 40 according to each of the first to fifth embodiments serves as a part of the changing module that turns on the second discharging switching element 36 while turning off the first discharging switching element 32 in step S30, but the present disclosure is not limited thereto.

Specifically, the drive IC 40 can serve as a part of the changing module that turns on both the first and second switching elements 32 and 36 from the state that one of the first and second switching elements 32 and 36 is turned on in step S30. This changes, in step S30, the impedance of the discharging path for the gate of the switching element S*# from one of the resistances R1 and R2 to the sum of the resistances R1 and R2.

In each of the first to fifth embodiments, the resistances R1 and R2 of the resistors 30 and 34 are each used as a parameter for changing the discharging rate of the gate of the switching element S*#, but the present disclosure is not limited thereto.

Specifically, a voltage level to be applied to the gate of the switching element S*# can be used as a parameter for changing the discharging rate of the gate of the switching element S*#.

In this modification, in step S32a (see FIG. 10, for example), the drive IC 40 can apply a negative bias voltage to the gate of the switching element S*# by, for example, connecting the gate to a portion lower in potential than the emitter of the switching element S*#. In addition, in step S30a, the drive IC 40 can apply a zero voltage to the gate of the switching element S*# by, for example, connecting the gate to the emitter of the switching element S*#. This operation in step S30a reduces the discharging rate of the switching element S*# in comparison to the discharging rate of the switching element S*# based on the operation in step S32a.

In each of the first to fifth embodiments, the sense voltage Vse is used as the sense signal output from the sense terminal of the switching element S*#, but the present disclosure is not limited thereto. Specifically, a signal correlated with the amount of current flowing through the conductive path of the switching element S*#, which varies in magnitude depending on the magnitude of the gate voltage Vge, can be used as the sense signal output from the sense terminal of the switching element S*#. In this modification, loosening the execution condition after the lapse of the predetermined period T1th since the shift of the drive signal g*# from the off state to the on state in comparison to the execution condition immediately after the shift of the drive signal from the off state to the on state is effective in reliably executing reduction of the discharging rate of the switching element S*#.

The operation in step S12 as the first module configured to start measuring time T1 in response to the shift of the drive signal g*# from the off state to the on state is not limited to that actually using the drive signal g*#. Specifically, another operation in step S12 configured to start measuring time T1 using, as a trigger, the timing at which the gate voltage of the constant-current switching element 22 is changed to a specific level can be used as the first module. The specific level shows a level required to turn on the constant-current switching element 22 that causes triggering of the shift of the drive signal g*# from the off state to the on state.

In the fourth embodiment, if it is determined that the input voltage VH to the inverter INV is lower than the threshold voltage Vhth, the drive unit DU for each switching element S*# is configured to loosen the execution condition only after the lapse of the preset time Tw since the collector-emitter voltage Vce was equal to or lower than the threshold voltage Vcth. As a modification of the configuration, the preset time Tw can be set to be variable depending on the input voltage VH and the collector current Ic. The level of the collector current Ic serves as a parameter correlated with the changing speed of the collector current Ic when the collector-emitter voltage Vce applied across the first and second ends of the conductive path of the switching element S*# is reduced during the shift of the switching element S*# from the off state to the on state.

As illustrated in FIG. 9B, the faster the reduction speed of the collector-emitter voltage Vce is, the more the length of the preset time Tw can be reduced. Thus, assuming that the switching speed of the switching element S*# from the off state to the on state is constant, the higher the level of the collector current Ic is, the greater the changing speed of the collector current Ic is, so that the more the length of the preset time Tw can be reduced.

In each of the first to fifth embodiments, an IGBT is used as a switching element S*# of each drive unit DU, but an N-channel MOSFET or a P-channel MOSFET can be used as a switching element S*# of each drive unit DU. In this modification, changing the potential difference of the on-off control terminal, i.e. the gate, of the P- or N-channel MOSFET to one end, i.e. the source, thereof permits turn-on or turnoff of the P- or N-channel MOSFET.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driver for driving, in response to a drive signal, a voltage-controlled switching element having a conductive path, an on-off control terminal, and a sense terminal from which a sense signal correlated with an amount of current flowing through the conductive path is output, the driver comprising:
   a discharging module configured to discharge, at a predetermined discharging rate, the on-off control terminal of the voltage-controlled switching element for changing the voltage-controlled switching element from an on state to an off state in response to the drive signal being shifted from an on state to an off state;
   a changing module configured to:
   determine whether a condition for executing reduction of the discharging rate of the on-off control terminal of the voltage-controlled switching element is met, the condition including a level of the sense signal being higher than a threshold level during the on state of the drive signal; and
   change the discharging rate of the on-off control terminal in response to the drive signal being shifted from the off state to the on state upon determination that the condition is met; and
   a loosening module configured to loosen the condition after a lapse of a predetermined period since the shift of the drive signal from the off state to the on state in comparison to the condition immediately after the shift of the drive signal from the off state to the on state.

2. The driver according to claim 1, wherein the loosening module is configured to loosen the condition after the lapse of the predetermined period since the shift of the drive signal from the off state to the on state in comparison to the condition while the drive signal is in the off state.

3. The driver according to claim 2, wherein the condition includes, in addition to the level of the sense signal being higher than the threshold level, a condition that the drive signal is in the on state, so that the loosening module is configured to loosen the condition after the lapse of the predetermined period since the shift of the drive signal from the off state to the on state in comparison to the condition while the drive signal is in the off state.

4. The driver according to claim 1, wherein the condition is that a duration when the level of the sense signal is higher than the threshold level is equal to or longer than threshold time, and the loosening module is configured to reduce the threshold time to thereby loosen the condition.

5. The driver according to claim 1, wherein the condition includes, in addition to the level of the sense signal being higher than the threshold level, a condition that the predetermined period has elapsed since the shift of the drive signal from the off state to the on state, so that the loosening module is configured to loosen the condition after the lapse of the predetermined period since the shift of the drive signal from the off state to the on state.

6. The driver according to claim 1, wherein the loosening module comprises:
   a first module configured to start measuring time in response to the shift of the drive signal from the off state to the on state, and;
   a second module configured to determine whether the predetermined period has elapsed since the shift of the drive signal from the off state to the on state as a function of the time measured by the first module.

7. The driver according to claim 1, wherein the conductive path of the voltage-controlled switching element has a first end and a second end opposite thereto, the voltage-controlled switching element being turned on or off based on a potential difference between one of the first and second terminals and the on-off control terminal, and the loosening module is configured to determine the predetermined period has elapsed since the shift of the drive signal from the off state to the on state when an absolute value of the potential difference is equal to or higher than a preset value.

8. The driver according to claim 1, wherein the conductive path of the voltage-controlled switching element has a first end and a second end opposite thereto, and the loosening module is configured to:
   compare an absolute value of a potential difference between the first and second ends of the conductive path of the switching element with a preset threshold value; and
   determine the predetermined period has elapsed since the shift of the drive signal from the off state to the on state after determination that, based on a result of the comparison, the absolute value of the potential difference between the first and second ends of the conductive path of the switching element is equal to or lower than the preset threshold value.

9. A driver for driving, in response to a drive signal, a voltage-controlled switching element having a conductive path, an on-off control terminal, and a sense terminal from which a sense signal correlated with an amount of current flowing through the conductive path is output, the driver comprising:
   a discharging module configured to discharge, at a predetermined discharging rate, the on-off control terminal of the voltage-controlled switching element for changing the voltage-controlled switching element from an on state to an off state in response to the drive signal being shifted from an on state to an off state;
   a determining module configured to determine whether a condition that a duration of a level of the sense signal being higher than a threshold level is equal to or longer than threshold time is met;
   a disabling module configured to disable the determining module from executing the determination until a predetermined period has elapsed since the shift of the drive signal from the off state to the on state; and a discharging-rate changing module configured to change the discharging rate of the on-off control terminal when it is determined by the determining module that the condition is met.

10. A control system for controlling a rotary machine, the control system comprising:
- an inverter equipped with at least one pair of voltage-controlled switching elements connected in series, each of the voltage-controlled switching elements having a conductive path, an on-off control terminal, and a sense terminal from which a sense signal correlated with an amount of current flowing through the conductive path is output; and
- a driver for driving each of the voltage-controlled switching elements, the driver comprising:
- a discharging module configured to discharge, at a predetermined discharging rate, the on-off control terminal of a corresponding one of the voltage-controlled switching elements for changing a corresponding one of the voltage-controlled switching elements from an on state to an off state in response to the drive signal being shifted from an on state to an off state;
- a changing module configured to:
- determine whether a condition for executing reduction of the discharging rate of the on-off control terminal of a corresponding one of the voltage-controlled switching elements is met, the condition including a level of the sense signal being higher than a threshold level during the on state of the drive signal; and
- change the discharging rate of the on-off control terminal of a corresponding one of the voltage-controlled switching elements in response to the drive signal being shifted from the off state to the on state upon determination that the condition is met; and
- a loosening module configured to loosen the condition after the lapse of the predetermined period since the shift of the drive signal from the off state to the on state in comparison to the condition immediately after the shift of the drive signal from the off state to the on state.

* * * * *